US012693592B2

(12) United States Patent
Nikipelov et al.

(10) Patent No.: US 12,693,592 B2
(45) Date of Patent: Jul. 28, 2026

(54) PELLICLE MEMBRANE FOR A LITHOGRAPHIC APPARATUS

(71) Applicant: ASML NETHERLANDS B.V., Veldhoven (NL)

(72) Inventors: Andrey Nikipelov, Eindhoven (NL); Sander Baltussen, Castenray (NL); Vadim Yevgenyevich Banine, Deurne (NL); Alexandr Dolgov, Waalre (NL); Inci Donmez Noyan, Eindhoven (NL); Zomer Silvester Houweling, Utrecht (NL); Arnoud Willem Notenboom, Rosmalen (NL); Marcus Adrianus Van De Kerkhof, Helmond (NL); Ties Wouter Van Der Woord, Helmond (NL); Paul Alexander Vermeulen, Eindhoven (NL); David Ferdinand Vles, Eindhoven (NL); Victoria Voronina, Veldhoven (NL); Halil Gökay Yegen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 930 days.

(21) Appl. No.: 17/637,891

(22) PCT Filed: Aug. 20, 2020

(86) PCT No.: PCT/EP2020/073323
§ 371 (c)(1),
(2) Date: Feb. 24, 2022

(87) PCT Pub. No.: WO2021/037662
PCT Pub. Date: Mar. 4, 2021

(65) Prior Publication Data
US 2022/0276553 A1 Sep. 1, 2022

(30) Foreign Application Priority Data

Aug. 26, 2019 (EP) ...................................... 19193590
Oct. 16, 2019 (EP) ...................................... 19203575
(Continued)

(51) Int. Cl.
*G03F 1/62* (2012.01)
*B82Y 30/00* (2011.01)
(Continued)

(52) U.S. Cl.
CPC .............. *G03F 1/62* (2013.01); *C01B 32/158* (2017.08); *G03F 7/702* (2013.01); *B82Y 30/00* (2013.01)

(58) Field of Classification Search
CPC ........ G03F 1/62; G03F 7/702; G03F 7/70191; G03F 7/70575; G03F 7/70916;
(Continued)

(56) References Cited

U.S. PATENT DOCUMENTS 9,897,930 B2 2/2018 Sjmaenok et al.
9,958,770 B2 5/2018 Ahn et al.
(Continued)

FOREIGN PATENT DOCUMENTS

CN 105129854 12/2015
CN 106406021 2/2017
(Continued)

OTHER PUBLICATIONS

International Search Report and Written Opinion issued in corresponding PCT Patent Application No. PCT/EP2020/073323, dated Dec. 4, 2020.
(Continued)

*Primary Examiner* — Caleen O Sullivan
(74) *Attorney, Agent, or Firm* — Pillsbury Winthrop Shaw Pittman, LLP

(57) ABSTRACT

A pellicle membrane for a lithographic apparatus, the membrane including uncapped carbon nanotubes. A method of regenerating a pellicle membrane, the method including decomposing a precursor compound and depositing at least some of the products of decomposition onto the pellicle membrane. A method of reducing the etch rate of a pellicle membrane, the method including providing an electric field in the region of the pellicle membrane to redirect ions from the pellicle, or heating elements to desorb radicals from the pellicle, preferably wherein the pellicle membrane is a carbon nanotube pellicle membrane. An assembly for a lithographic apparatus, the assembly including a biased electrode near or including the pellicle membrane or heating means for the pellicle membrane.

20 Claims, 16 Drawing Sheets

(30) Foreign Application Priority Data

| | | |
|---|---|---|
| Oct. 24, 2019 | (EP) ..................................... | 19205058 |
| Mar. 9, 2020 | (EP) ..................................... | 20161779 |

(51) Int. Cl.

| | |
|---|---|
| *C01B 32/158* | (2017.01) |
| *G03F 7/00* | (2006.01) |

(58) Field of Classification Search

CPC . G03F 7/70983; C01B 32/158; C01B 32/168; B82Y 30/00

USPC ........................................................... 430/5

See application file for complete search history.

(56) References Cited

U.S. PATENT DOCUMENTS

| | | | |
|---|---|---|---|
| 2006/0057050 | A1 | 3/2006 | Ren et al. |
| 2008/0008925 | A1 | 1/2008 | Deng et al. |
| 2009/0075157 | A1 | 3/2009 | Pak et al. |
| 2010/0047522 | A1 | 2/2010 | Sivarajan et al. |
| 2011/0249243 | A1 | 10/2011 | Smaenok et al. |
| 2012/0234694 | A1 | 9/2012 | Vecitis et al. |
| 2016/0139501 | A1 | 5/2016 | Kim et al. |
| 2018/0329289 | A1* | 11/2018 | Gallagher ................. G03F 1/62 |
| 2018/0329291 | A1* | 11/2018 | Timmermans ............ G03F 1/64 |
| 2019/0003370 | A1 | 1/2019 | Nomura et al. |
| 2019/0129300 | A1 | 5/2019 | Ono et al. |
| 2019/0137865 | A1* | 5/2019 | Lin ............................ G03F 1/22 |
| 2019/0212654 | A1 | 7/2019 | Eva |

FOREIGN PATENT DOCUMENTS

| | | |
|---|---|---|
| EP | 3373069 | 9/2018 |
| JP | 2006114650 | 4/2006 |
| JP | 2009256189 | 11/2009 |
| JP | 2011066259 | 3/2011 |
| JP | 2011530184 | 12/2011 |
| JP | 2018194838 | 12/2018 |
| KR | 20100081098 | 7/2010 |
| KR | 20180103775 | 9/2018 |
| TW | 201712426 | 4/2017 |
| TW | 201719274 | 6/2017 |
| TW | I587079 | 6/2017 |
| TW | 201728992 | 8/2017 |
| TW | 201738650 | 11/2017 |
| TW | 201834017 | 9/2018 |
| WO | 2018008594 | 1/2018 |
| WO | 2019/092318 | 5/2019 |
| WO | 2019115218 | 6/2019 |
| WO | 2021037662 | 3/2021 |

OTHER PUBLICATIONS

Office Action issued in corresponding Chinese Patent Application No. 202080059811, dated Mar. 28, 2025.

Office Action issued in corresponding Japanese Patent Application No. 2022-506885, dated May 23, 2024.

Israeli Office Action issued in corresponding Israeli Patent Application No. 290239, dated Nov. 3, 2022.

Office Action issued in corresponding Japanese Patent Application No. 2024-171959, dated Jul. 9, 2025.

Office Action issued in Korean Patent Application No. 10-2022-7005955, dated May 19, 2025.

Communication issued in corresponding European Patent Application No. 25188092.8, dated Feb. 4, 2026.

J. Lee et al., "Boron Nitride Nanotubes and its Industrial Applications," KIC News, vol. 20, No. 4 (2017).

Communication issued in corresponding Korean Patent Application No. 10-2025-7024487, dated Jan. 9, 2026.

* cited by examiner

100

101

PELLICLE MEMBRANE FOR A LITHOGRAPHIC APPARATUS

This application is the U.S. national phase entry of PCT Patent Application No. PCT/EP2020/073323 which was filed on Aug. 20, 2020, which claims the benefit of priority of European Patent Application No. 19193590.7 which was filed on Aug. 26, 2019 and European Patent Application No. 19203575.6 which was filed on Oct. 16, 2019 and European Patent Application No. 19205058.1 which was filed on Oct. 24, 2019 and European Patent Application No. 20161779.2 which was filed on Mar. 9, 2020 and which are all incorporated herein in their entireties its entirety by reference.

The present invention relates to a pellicle membrane for a lithographic apparatus, a method of regenerating a pellicle membrane, methods of reducing the etch rate of a pellicle membrane, and an assembly for a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic apparatus includes a patterning device (e.g. a mask or reticle). Radiation is provided through or reflected off the patterning device to form an image on a substrate. A membrane assembly, also referred to as a pellicle, may be provided to protect the patterning device from airborne particles and other forms of contamination. Contamination on the surface of the patterning device can cause manufacturing defects on the substrate.

Pellicles may also be provided for protecting optical components other than patterning devices. Pellicles may also be used to provide a passage for lithographic radiation between regions of the lithography apparatus which are sealed from one another. Pellicles may also be used as filters, such as spectral purity filters or as part of a dynamic gas lock of a lithographic apparatus.

A mask assembly may include the pellicle which protects a patterning device (e.g. a mask) from particle contamination. The pellicle may be supported by a pellicle frame, forming a pellicle assembly. The pellicle may be attached to the frame, for example, by gluing or otherwise attaching a pellicle border region to the frame. The frame may be permanently or releasably attached to a patterning device.

Due to the presence of the pellicle in the optical path of the EUV radiation beam, it is necessary for the pellicle to have high EUV transmissivity. A high EUV transmissivity allows a greater proportion of the incident radiation through the pellicle and reducing the amount of EUV radiation absorbed by the pellicle may decrease the operating temperature of the pellicle. Since transmissivity is at least partially dependent on the thickness of the pellicle, it is desirable to provide a pellicle which is as thin as possible whilst remaining reliably strong enough to withstand the sometimes hostile environment within a lithography apparatus.

It is therefore desirable to provide a pellicle which is able to withstand the harsh environment of a lithographic apparatus, in particular an EUV lithography apparatus.

Whilst the present application generally refers to pellicles in the context of lithography apparatus, in particular EUV lithography apparatus, the invention is not limited to only pellicles and lithography apparatus and it is appreciated that the subject matter of the present invention may be used in any other suitable apparatus or circumstances.

For example, the methods of the present invention may equally be applied to spectral purity filters. Some EUV sources, such as those which generate EUV radiation using a plasma, do not only emit desired 'in-band' EUV radiation, but also undesirable (out-of-band) radiation. This out-of-band radiation is most notably in the deep UV (DUV) radiation range (100 to 400 nm). Moreover, in the case of some EUV sources, for example laser produced plasma EUV sources, the radiation from the laser, usually at 10.6 microns, presents a significant out-of-band radiation.

In a lithographic apparatus, spectral purity is desired for several reasons. One reason is that the resist is sensitive to out of-band wavelengths of radiation, and thus the image quality of patterns applied to the resist may be deteriorated if the resist is exposed to such out-of-band radiation. Furthermore, out-of-band radiation infrared radiation, for example the 10.6 micron radiation in some laser produced plasma sources, leads to unwanted and unnecessary heating of the patterning device, substrate, and optics within the lithographic apparatus. Such heating may lead to damage of these elements, degradation in their lifetime, and/or defects or distortions in patterns projected onto and applied to a resist-coated substrate.

A typical spectral purity filter may be formed, for example, from a silicon foundation structure (e.g. a silicon grid, or other member, provided with apertures) that is coated with a reflective metal, such as molybdenum. In use, a typical spectral purity filter might be subjected to a high heat load from, for example, incident infrared and EUV radiation. The heat load might result in the temperature of the spectral purity filter being above 800° C. Under the high head load, the coating can delaminate due to a difference in the coefficients of linear expansion between the reflective molybdenum coating and the underlying silicon support structure. Delamination and degradation of the silicon foundation structure is accelerated by the presence of hydrogen, which is often used as a gas in the environment in which the spectral purity filter is used in order to suppress debris (e.g. debris, such as particles or the like), from entering or leaving certain parts of the lithographic apparatus. Thus, the spectral purity filter may be used as a pellicle, and vice versa. Therefore, reference in the present application to a 'pellicle' is also reference to a 'spectral purity filter'. Although reference is primarily made to pellicles in the present application, all of the features could equally be applied to spectral purity filters.

In addition, it is desirable to improve the lifespan of optical elements within a lithographic apparatus, such as the collector mirror, pellicle, or components of the dynamic gas lock. These optical elements are exposed to the harsh environment of the lithographic apparatus when in use and so can become damaged over time. It is desirable to prevent, reduce, or eliminate damage to the optical elements.

In a lithographic apparatus (and/or method) it is desirable to minimise the losses in intensity of radiation which is being used to apply a pattern to a resist-coated substrate. One reason for this is that, ideally, as much radiation as possible should be available for applying a pattern to a substrate, for instance to reduce the exposure time and increase throughput. At the same time, it is desirable to minimise the amount of undesirable radiation (e.g. out-of-band) radiation that is passing through the lithographic apparatus and which is incident upon the substrate.

Furthermore, it is desirable to ensure that a spectral purity filter and/or pellicle used in a lithographic method or apparatus has an adequate lifetime, and do not degrade rapidly over time as a consequence of the high heat or radiation load to which the they may be exposed, and/or the hydrogen and corresponding active species (such as radicals including H* and HO* and ions, including $H^+$, $H_{2+}$ and $H_3^+$) to which they may be exposed. It is therefore desirable to provide an improved (or alternative) spectral purity filter and/or pellicle, or adapt a lithographic apparatus and/or method to make the environment less aggressive towards pellicle and/or spectral purity filter.

The present invention has been devised in an attempt to address at least some of the problems identified above.

SUMMARY OF THE INVENTION

According to a first aspect of the present invention, there is provided a pellicle membrane for a lithographic apparatus, said membrane comprising uncapped carbon nanotubes.

In use, pellicle membranes lie in the direct light path of the radiation, such as EUV radiation, used in the lithographic apparatus. This, along with operation at low ambient pressures, results in the membrane reaching high temperatures, which can be in excess of 600° C. This can facilitate chemical and structural degradation of the pellicle membrane that may lead to a loss of imaging performance or even failure of the pellicle. In order to reduce the operating temperature of a pellicle, one or more emissive layers are generally included which increase the emissivity of the pellicle and thereby reduce the operating temperature of the pellicle at a given power. Continuous membrane pellicles provided with emissive layers typically have operating temperatures in the range of 400-650° C. in the EUV lithographic apparatus, with source EUV power in the range of 150 to 300 W (at the intermediate focus), higher temperatures may be expected with higher power sources. In addition, there may be provided a capping layer which slows or prevents chemical degradation of the pellicle membrane. In order to maintain acceptable transmissivity and infrared (IR) emissivity of the pellicle, the one or more emissive metallic or conducting layer is thin. However, metallic films deposited on an inert substrate are in an energetically unfavourable state. The heating of a thin metallic film applied on top of an inert (non-metallic) substrate can lead to thermal instability at temperatures well below the melting point of the metal. As sufficient activation energy is provided, the thin film forms holes through a surface diffusion process and the holes grow with time at a rate strongly dependent on temperature. When the holes coalesce, the material on the surface forms irregularly shaped islands. This process is referred to as dewetting and island formation. It is possible to reduce dewetting and island formation by providing an adhesion layer between the metallic film and the substrate, but the metallic film still remains in an energetically unfavourable state. The thin metallic layer applied on the pellicle, once broken into islands loses its high emissivity property and thus is rendered useless.

It has been realised that a pellicle membrane comprising uncapped carbon nanotubes is suitable for use in a lithographic apparatus, specifically an EUV lithographic apparatus, especially if EUV plasma-induced carbon etch may be sufficiently suppressed. Previously, only carbon nanotubes (CNTs) with capping layers have been considered, due to the possibility of carbon etch and CNT failure in the EUV $H_2$ plasma environment. However, capping of carbon nanotubes with materials that are resistant to hydrogen plasma in order to provide EUV plasma resistance and their use as pellicle membranes in a lithographic apparatus is not suitable. In addition, the capping of carbon nanotubes reduces transmissivity compared to uncapped nanotubes, which is also undesirable.

The uncapped, carbon nanotube based pellicle may further comprise a plurality of nanoparticles. In contrast to a conformal coating or a capping layer, nanoparticles are not liable to dewetting or island formation and so the transmission and emissivity of the pellicle are not affected during use. In addition, the nanoparticles are not in as great an energetically unfavourable state as a corresponding thin metallic film, and so are more stable during use. In addition, EUV scattering and absorption by nanoparticle sub-monolayer is naturally lower than scattering and absorption by conformal or partially conformal layer with comparable thickness, applied to nanotubes.

The nanoparticles are preferably associated with the carbon nanotubes. As such, the nanoparticles are attached to the nanotubes rather than being separate from the nanotubes. It is desirable to avoid contamination of the lithographic apparatus, particularly the optical elements such as mirrors or the reticle, and so it is desirable for the nanoparticles to not be able to be readily removed from the pellicle membrane.

The nanoparticles may be disposed on the surface of the carbon nanotubes. The nanoparticles may be disposed within the carbon nanotubes. The nanoparticles may be disposed on both the surface of and within the nanotubes.

The nanoparticles can be attached to the surface of the carbon nanotubes by any appropriate technique and the invention is not particularly limited by the technique selected. The method used to produce the carbon nanotube-nanoparticle structures can be, for example, based on so-called wet chemistry methods or based on physical deposition. In wet chemistry methods, the surface of the nanotube can be functionalised and the nanocrystals can subsequently be assembled onto the nanotubes by covalent, non-covalent, or electrostatic interactions. In physical deposition, the nanoparticles can be attached to the nanotubes by physical adsorption.

Similarly, any suitable technique for providing nanoparticles within the nanotubes may be used and the invention is not particularly limited to the technique used. One technique is incipient wetness impregnation where a solution of a metal salt precursor is introduced into the nanotube and then reduced by hydrogen. A calcination step may also be required.

It has been found that the mechanism of carbon etching in EUV lithography apparatus is a two-factor process. In particular, both hydrogen ions (e.g. $H^+$, $H_3^+$) and hydrogen radicals H* are required to etch the carbon. Without wishing to be bound by scientific theory, it is believed that a carbon-carbon bond in the nanotube may be broken by an energetic hydrogen ion. The broken bond may be passivated by a dissolved or adsorbed hydrogen radical. If passivation does not occur, the bond is able to recover. It is believed that the addition of nanoparticles increases the recombination rate of adsorbed hydrogen radicals and so the chances of a broken carbon-carbon bond being passivated by a hydrogen radical is reduced. As such, the rate at which the carbon nanotubes are etched is reduced.

For example, in an embodiment in which the carbon nanotubes are decorated with nanoparticles, adsorbed atomic hydrogen is able to diffuse along the carbon nanotube. The atomic hydrogen is able to either recombine into molecular hydrogen and outgas as hydrogen gas, or could passivate a broken carbon bond eventually resulting in outgassing of a hydrocarbon. The recombination of atomic hydrogen occurs more quickly on the nanoparticles than the nanotubes, so the presence of the nanoparticles increases the hydrogen recombination rate and thereby reduces the rate at which broken carbon bonds are passivated and reduces the rate at which nanotubes are etched.

It has been found that the presence of nanoparticles inside the nanotubes also serves to increase the recombination rate of atomic hydrogen into molecular hydrogen. Atomic hydrogen adsorbed on the CNT outer surface may pass through graphene or graphene-like film (for chiral CNTs) by hopping/diffusion and so reach nanoparticles which are decorating an inner CNT surface. Again, without wishing to be bound by scientific theory, it is believed that the presence of the nanoparticles increases the recombination rate of adsorbed atomic hydrogen despite being located within the nanotubes. A further advantage of this embodiment is that it is almost impossible for the nanoparticles to be removed from the nanotubes and so there is very little risk of the nanoparticles being released from the pellicle membrane and contaminating other parts of the lithographic apparatus.

The nanotubes comprising the (EUV) pellicle membrane may form a gas-permeable mesh. Pellicle membranes are generally very thin free-standing membranes and are therefore susceptible to deformation if there is a pressure difference between the two faces of the membrane. Even minor pressure differentials can result in deformation of the pellicle membrane. Other pellicle membranes comprise unitary films which are effectively impermeable to gases. In contrast, one embodiment of the present invention provides a pellicle membrane which is gas-permeable. This avoids the presence of any pressure differentials across the membrane and therefore reduces deformation of the membrane.

The carbon nanotubes may be single-walled or multi-walled. The pellicle membrane may comprise single-walled nanotubes, multi-walled nanotubes, or combinations thereof. Preferably, the pellicle membrane comprises single-walled nanotubes.

The diameter of the nanoparticles may range from about 1 nm to about 100 nm. Preferably, the diameter of the nanoparticles ranges from about 5 nm to about 25 nm. The diameter of the nanoparticles is preferably measured by transmission electron microscopy. It will be appreciated that other measurement techniques may be used. The diameter of any nanoparticles disposed within the carbon nanotubes will depend on the internal diameter of the nanotubes. As such, the diameter of any internal nanoparticles may be up to the internal diameter of the nanotubes in which they are disposed.

The diameter of the nanoparticles does not necessarily have to be the same for each nanoparticle within the population of nanoparticles. As such, some nanoparticles may be larger or smaller than others. In embodiments, the average diameter of the nanoparticles is from about 1 nm to about 100 nm, and preferably from about 5 nm to about 25 nm.

These sizes of nanoparticle are advantageous as they reduce imaging distortion via refraction and extinction of EUV radiation.

The diameter of the nanoparticles is preferably less than half of the critical dimension of a pattern of a corresponding reticle. As such, preferably none or substantially none of the nanoparticles have a diameter greater than half of the critical dimension of a pattern of a corresponding reticle. In the event that a nanoparticle does transfer from the pellicle membrane to the reticle, if the nanoparticle is smaller than around half of the critical dimension of the reticle onto which it transfers, the impact on the patterning will not be detrimental. With current technologies, this provides a preference for nanoparticles having a diameter of less than or equal to about 10 nm. As the critical dimension reduces, the size of the nanoparticles will also need to reduce.

The average distance between adjacent nanoparticles may be greater than the diameter of the nanoparticles. For example, where the nanoparticles are 10 nm in diameter (as measured by TEM), the average distance between adjacent nanoparticles is preferably greater than 10 nm.

The average distance between adjacent nanoparticles may be from around 1 to around 50 times the diameter of the nanoparticles. The average distance between adjacent nanoparticles may be greater than or equal to around ten times the diameter of the nanoparticles. A slightly lower average distance may also be acceptable.

Since the nanoparticles will slightly reduce the transmissivity of the pellicle membrane, it is desirable to balance the advantages of the increase in atomic hydrogen recombination with the disadvantage of lower transmissivity. By spreading out the nanoparticles across the pellicle membrane the decrease in transmissivity is managed whilst still maintaining the protective properties of the nanoparticles. In addition, spreading out the nanoparticles also reduces or prevents agglomeration of the nanoparticles, which would lead to an increase in the size of the particles and lower transmissivity.

The nanoparticles preferably comprise a material which has a higher recombination coefficient for hydrogen than the nanotubes. The recombination coefficient of the nanoparticles is preferably from about 0.1 to about 1. Recombination efficiency is the fraction of adsorbed atoms which form molecules before leaving the surface. As such, a figure of 1 indicates that all of the adsorbed atoms form molecules before leaving the surfaces, whereas a figure of 0.1 indicates that around 10% do. The recombination rate of carbon nanotubes is around $10^{-3}$, which is the same as graphene or amorphous carbon. As the recombination rate of the nanoparticles is greater than that of the carbon nanotubes, it is believed that adsorbed atomic hydrogen is combined more quickly and thereby limits the likelihood that a broken carbon-carbon bond will be passivated.

The nanoparticles may comprise a metal, a metal oxide, a doped metal, an alloy, or combinations thereof.

The nanoparticles may comprise Nb, Mo, Ru, Rh, Pt, Pd, W, Cr, Ni, Fe, Co, Ag, Au, Zr, Y, and combinations thereof.

The nanoparticles may additionally comprise O, N, B, Si, C, H, P, S, Cl, and combinations thereof.

As such, the nanoparticles may comprises one or more of the metals described herein doped or mixed with one or more of O, N, B, Si, C, P, S, Cl, and H.

The nanoparticles may comprise composite material. In other words, the nanoparticles may be composite nanoparticles. As such, there may be two or more different materials forming the nanoparticle. Some materials may serve to increase the rate of recombination of adsorbed atomic hydrogen and other materials may assist with improved binding to the CNTs.

These materials (at least a metallic phase of the nanoparticles) have much higher recombination rates than carbon and so nanoparticles comprising such materials serve to extend the lifespan of a carbon nanotube pellicle membrane by reducing the rate at which carbon-carbon bonds are passivated by adsorbed atomic hydrogen.

The surface density of nanoparticles may be greater than around 500 particles per square micron, preferably greater than around 1000 particles per square micron.

Having too few nanoparticles will mean that at least some portions of the carbon nanotubes are effectively not protected from atomic hydrogen passivation. As such, whilst portions of the carbon nanotubes near to the nanoparticles will be protected, portions of the carbon nanotubes which are too far away from the nanoparticles will not be protected.

Additionally or alternatively, the uncapped carbon nanotubes may have been passivated. The passivation may be chemical passivation. The uncapped carbon nanotubes may be altered by the chemisorption of chemical species to the surface of the nanotubes. The alteration of the surface may be by chemisorption (as opposed to physisorption) or by the reaction of species with the carbon nanotube surface via processes such as nitridation, oxidation, or halogenation. Hydrogenation is explicitly excluded since this will likely enhance the etching process and therefore has the opposite effect of what is desired. As such, intentional hydrogenation of the carbon nanotubes is undesired. It will be appreciated that the pellicle membrane may become hydrogenated in use due to the environment within an EUV lithographic apparatus, but this hydrogenation is an undesired side-effect of how the apparatus operates. Passivation may also be achieved by the addition of strontium, boron, beryllium or silicon atoms to the surface of the carbon nanotubes.

This approach differs from applying a coating to the surface of the carbon nanotubes since it entails the chemical modification of the surface of the carbon nanotubes themselves meaning that an interface layer is not formed. There are also no delamination effects caused by differing coefficients of thermal expansion, as are seen with systems including coated carbon nanotubes.

Without wishing to be bound by scientific theory, it is believed that the alteration of the surface of the nanotubes attenuates etching by plasma by a number of mechanisms. The atoms which are attached to the surface of the carbon nanotube shield the carbon atoms of the nanotube from bombardment by etching ions, which are primarily hydrogen ions in the case of EUV-induced hydrogen plasma. The surface atoms must first be etched, thereby creating a resilience time or a delay before the carbon atoms are etched. Other mechanisms by which the carbon nanotubes are protected may also be present. It will be appreciated that the surface atoms may be etched, but that the pellicle membrane may be repaired by re-passivation of the surface. This may be achieved by the method according to the second aspect of the present invention.

Preferred surface modifications are oxidation, nitrogenation, and halogenation. For halogenation, fluorination and chlorination are preferred due to the strength of the carbon-halogen bond, particularly the carbon-fluorine bond. As such, there is provided a pellicle membrane for a lithographic apparatus, said membrane comprising uncapped carbon nanotubes, wherein at least a portion of the surface of the uncapped carbon nanotubes has been chemically passivated. Preferably, the chemical passivation includes nitrogenation, oxidation, and/or halogenation. The chemical passivation does not include hydrogenation. Alternatively or additionally, the surface may be modified by the addition of atoms of strontium, boron, beryllium, and/or silicon.

In embodiments, the uncapped carbon nanotubes are doped with atoms other than carbon. Preferably, the uncapped carbon nanotubes are doped with one or more of nitrogen, boron, and silicon. Doping of the core carbon nanotube structure entails the incorporation of foreign atoms into the core structure. Defects in the carbon nanotube structure, which may be naturally present or may be created intentionally, can be filled with atoms other than carbon, such as nitrogen, boron, or silicon.

Pellicles comprising carbon nanotubes which have been modified to additionally include nitrogen, boron, and/or silicon in their core structure reduce the susceptibility to etching by hydrogen ions and radicals due to the altered chemical bonding state which changes the reactivity. In addition, the nanotubes are metallic irrespective of chirality or number of walls. This increases the emissivity of the nanotubes, which consequently reduces the operating temperature of the pellicle at a given power, thereby extending the lifespan of the pellicle. The nanotubes may also be physically stronger than nanotubes which include defects in the core structure.

An aerogel layer may be provided on one or both faces of the pellicle membrane. Aerogels are materials which have a very high porosity and a very low density. The porosity of the aerogel may be over 95%, over 97%, over 99%, or even up to 99.9%. The density can be less than 0.01 g/cm$^3$.

Due to the very high porosity and density, aerogels have high EUV transmissivity. Aerogels can provide a protective layer for the carbon nanotubes as they do not greatly reduce the transmissivity of the pellicle membrane due to their high EUV transmissivity, and they serve as a barrier between the hydrogen plasma and the carbon nanotube-based pellicle membrane. Due to the high porosity of the aerogel, pressure differentials across the pellicle membrane are avoided.

The aerogel may comprise niobium, molybdenum, or zirconium. These materials are resistant to the hydrogen plasma environment inside a lithographic apparatus.

The thickness of the or each aerogel layer may be less than 2 microns, less than 1 microns, or less than 0.5 microns.

As such, according to a further aspect of the present invention, there is provide an optical element for use in a lithographic apparatus, said optical element comprising an aerogel.

The optical element may be a pellicle membrane, a mirror, a reticle, or a spectral purity filter. The optical element may be located at an intermediate focus position in order to prevent or reduce the transfer of contaminants from one portion of a lithographic apparatus to another portion.

The optical element may comprise a pellicle membrane according to any aspect of the present application.

According to a second aspect of the present invention, there is provided a method of regenerating and/or conditioning a pellicle membrane, said method comprising decomposing a precursor compound and depositing at least some of the products of decomposition onto the pellicle membrane.

As described, carbon nanotubes are etched by hydrogen within a lithographic apparatus. During the etching process, carbon atoms are removed from the carbon nanotubes as hydrocarbons. Over time, the removal of carbon from the nanotubes weakens the pellicle membrane, which can lead to the formation of particles or the failure of the pellicle membrane. By providing and decomposing a precursor compound to generate decomposition products, the decomposition products are able to repair any damage to the pellicle membrane and thereby extend its life.

The precursor may be a hydrocarbon. When a hydrocarbon is decomposed within a lithographic apparatus, it is decomposed into carbon and hydrogen. Where the pellicle membrane comprises carbon nanotubes, the carbon resulting from the decomposition is able to repair damage to the nanotubes. Although it is appreciated that the pellicle may be etched and release hydrocarbons, these are at low concentrations, so the provision of additional hydrocarbons causes the rate at which carbon is redeposited on the pellicle membrane to approximately balance the rate at which carbon is etched from the pellicle. It will be appreciated that if the rate at which carbon is etched from the pellicle membrane is the same as the rate at which the carbon is redeposited, the pellicle can have a greatly extended lifespan. The rate and amount of hydrocarbon which is introduced into the lithographic apparatus will vary depending on the operating conditions within the lithographic apparatus, such as the power level at which the apparatus is being operated and the partial pressure of hydrogen present within the apparatus. It is possible to adjust the rate and amount of hydrocarbon being introduced in order to balance the etching of the carbon nanotube pellicle. It will be appreciated that this method does not necessarily take place within a lithographic apparatus and may also be carried out outside of a lithographic apparatus. The present method may therefore take place before the pellicle is used in a lithographic apparatus as a pre-conditioning step, or may take place after the pellicle has been used in a lithographic apparatus in order to repair any damage caused to the pellicle during use.

The hydrocarbon may be saturated or unsaturated. The hydrocarbon may be a C1-C4 hydrocarbon, or aromatic (C6 or larger) or cyclic (C5 or larger) hydrocarbon and may also include any of N, O, B, P, and Cl. Ethene or ethyne may be used as the hydrocarbon. Unsaturated hydrocarbons may be advantageous as they have a greater ratio of carbon to hydrogen than saturated hydrocarbons.

Hydrocarbons can be decomposed by EUV radiation into carbon and hydrogen. Hydrocarbons can also be decomposed by other means and the decomposition is not to be considered as being exclusively by EUV radiation exposure. Shorter chain hydrocarbons may be preferred as they are less likely to deposit on and stick to surfaces within the lithographic apparatus, other than the pellicle and cause lasting partial loss of reflectivity of optics. Eventually, such carbon-rich layers are cleaned by EUV $H_2$ plasma, provided the injection of hydrocarbons is terminated.

The precursor compound may be provided continuously or intermittently. Continuous provision of the precursor compound may be used where there is a consistent etch rate of the pellicle membrane and so the continuous addition of the hydrocarbon provides a steady state for the pellicle membrane where the rate at which carbon is etched from the pellicle is substantially the same as the rate at which carbon is deposited on the pellicle membrane. The precursor compound may be provided intermittently such that the additional hydrocarbon material is only present during at predetermined times so that the throughput of the lithographic apparatus is not adversely affected, whilst throughput may be temporarily reduced due to deposition of opaque carbon layers on some of the optical elements.

An amount of precursor compound may be adjusted depending on one or more of: an etch rate of the pellicle membrane, an operating power of a lithographic apparatus in which the pellicle membrane is disposed, and an operational lifetime of the pellicle membrane. For example, where the etch rate of the pellicle is high, which may be when the apparatus is operating at high power, a greater amount of precursor compound may be introduced in order to offset the higher etch rate. When the apparatus is operating at a lower power, the amount of precursor compound being introduced may be reduced in order to avoid unwanted build-up of carbon on the pellicle membrane or other areas of the apparatus.

The method may comprise directing the precursor compound towards the pellicle membrane or at least locally within a reticle mini-environment (RME), which is coupled to the scanner environment. As it is intended for the precursor compound to decompose and repair the pellicle membrane, it is desirable to preferentially deposit the carbon generated by the decomposition on the pellicle membrane rather than other areas of the apparatus. As such, directing a flow of the precursor compound towards the pellicle membrane increases the likelihood of the carbon being deposited on the pellicle membrane.

In embodiments of the second aspect of the present invention, there is provided a method of conditioning and/or repairing a carbon nanotube pellicle membrane, said method including the step of annealing the carbon nanotube pellicle membrane in a hydrocarbon-containing atmosphere.

The annealing in a hydrocarbon-containing atmosphere results in the repair of any dangling bonds and replacement of hydrogen bonded to carbon defect sites with carbon from the hydrocarbon atmosphere. The annealing may be conducted at a temperature of from around 700 to 900 K. It will be appreciated that other temperatures may be used as required. The annealing in the hydrocarbon atmosphere may be referred to as reactive annealing. It will be appreciated that decomposition of a hydrocarbon precursor takes place during this reactive annealing step. The hydrocarbon-containing gas may be ionised to form a plasma. The ionisation into a plasma increases reaction rates, allows lower temperatures to be used, and improves reaction selectivity.

The method of the second aspect of the present invention may further include a vacuum annealing step, optionally wherein the vacuum annealing step is before and/or after the step of annealing in a hydrocarbon-containing atmosphere.

The method may also include a reductive annealing step. The reductive annealing step may take place before and/or after the reactive annealing step. The reductive annealing may take place within a reductive gas, such as hydrogen. The reductive annealing step removes loosely bound and amorphous carbon deposits as well as other contaminants, such as remaining seed nanoparticles from the carbon nanotube growth process.

Preferably, the final annealing step is a vacuum or a reductive annealing step. This is in order to avoid transient effects during exposures in the scanner environment, which is highly reductive due to the presence of EUV radiation and hydrogen plasma and ions. The pellicle membrane of the method of the second aspect of the present invention may be a pellicle membrane according to any other aspect, particularly the first aspect, of the present invention.

In an exemplary method, the following steps are carried out:

1. Vacuum or reductive annealing;
2. Reactive annealing in a hydrocarbon environment;
3. Optional repetition of steps 1 and 2; and
4. Vacuum or reductive annealing.

This exemplary method is useful for pellicle membranes which have yet to be exposed to the scanner environment. For pellicle membranes which have already been exposed to the scanner environment, the method may be modified to start with a reactive annealing step rather than a passive or reductive healing step.

Even in cases where no reactive annealing step is included during the manufacture of a carbon nanotube pellicle membrane, there may be a vacuum and/or reductive annealing step prior to the exposing the pellicle in the scanner environment. As such, there is provided a method of conditioning a pellicle membrane, said method including the step of vacuum and/or reductive annealing the pellicle membrane prior to use in a lithographic apparatus.

Any of the aforementioned annealing steps may be carried out at a temperature of from about 700 K to about 900K.

The heating of the pellicle membrane during annealing may be carried out by any suitable means. For example, the pellicle membrane may be heated conductively and/or convectively by exposure to hot gas. The pellicle membrane may be heated by passing an electrical current through the pellicle membrane. The pellicle membrane may be heated by laser heating. Combinations of different heating methods are also contemplated.

According to a third aspect of the present invention, there is provided a method of reducing the etch rate of a pellicle, said method comprising providing a one or more biased elements in the region near to or of the pellicle. The bias is with respect to a grounded vacuum vessel of a lithographic apparatus in which the pellicle is disposed. The bias redirects flux of positive ions away from the pellicle. Preferably, any or most of the biased elements have a negative potential with respect to the (grounded) scanner vacuum vessel, to avoid raising EUV plasma potential, which may be detrimental for EUV optics. As such, whilst the relative bias of the pellicle or other elements may be positive, the absolute potentials are preferably all negative to avoid plasma potential increase.

Since plasma comprises positively charged hydrogen atoms, providing a suitable bias/electric field will redirect the flux of etching ions away from the pellicle. With a reduced flux of etching ions, the lifetime of the pellicle membrane will be extended. The pellicle membrane may be a carbon nanotube pellicle membrane, although the method may equally be used in respect of other pellicle membrane materials.

The method may comprise biasing the pellicle membrane with respect to reticle (front side) and/or ReMa blades and/or UNICOM. ReMa blades are part of a Reticle Masking unit (REMA) which is a shutter system comprising four independently moving masking blades. The REMA unit blocks light from specific areas of the reticle using the (metal) blades. Of these blades, two Y blades are oriented in a scan direction, whilst two X blades are perpendicular to the scan direction. The UNICOM is an optical filter, the function of which is to adjust illumination near the reticle to ensure slit uniformity. The filter generally comprises two movable plates that can be moved along a Y scanning axis in order to adjust the illumination. As it is the flux of positive hydrogen ions which etches the pellicle membrane, by biasing the pellicle membrane with respect to nearest surface/surfaces (for example by applying absolute negative potentials, or apply a bias between pellicle and other electrodes that is positive relative to each other), the flux of hydrogen ions towards the pellicle is reduced/redirected. The method may alternatively or additionally comprise relative biasing of surfaces, other than pellicle; while leaving the pellicle floating or grounded, for example biasing or relative biasing of reticle (front side) and/or ReMa blades and/or UNICOM in order to extract ions, produced within EUV cone before they reach the pellicle. Although absolute positive potential electrodes in the reticle mini-environment may be used, such potential may increase the plasma potential and ion energy in the vicinity of sensitive components and therefore in such an embodiment additional measures may be needed for the protection of such components.

According to a fourth aspect of the present invention, there is provided an assembly for a lithographic apparatus, said assembly including a biased pellicle membrane and/or other surfaces within a RME. The other surface may be a reticle front side, ReMa blades or UNICOM or Y-nozzle. A Y-nozzle is a nozzle for purge gas supply directed along the reticle in the scanning direction. Alternatively or additionally, the pellicle membrane and/or reticle front side are floating whilst the Rema blades and/or UNICOM are biased negatively with respect to a grounded vacuum vessel wall.

Preferably, the absolute potentials applied to any of electrodes in RME are negative or limited to no more than +50 V to avoid increasing of EUV plasma potential, otherwise EUV optics may be affected by too energetic ions. The absolute potential applied to the surfaces in RME may be less than or equal to around −500 V, preferably less than or equal to around −250 V, and more preferably less than or equal to around −50 V. The bias is kept relatively low in order to avoid sparking. Sparking may discharge the capacitor (for example the pellicle/reticle masking unit or the pellicle/reticle) through gas ionised by EUV absorption. A single spark could cause the pellicle membrane to fail or at least introduce a defect. Even at a relatively low voltage, such a bias is sufficient to repel the majority of ions introduced by each EUV flash near the pellicle. In addition, limiting the bias of pellicle with respect to the nearest electrodes to 100 V or less limits the electrostatic pressure acting upon the pellicle. This avoids unwanted deflection or rupture of the pellicle membrane.

The bias source may be current limited and/or pulsed, with bias pulses preferably synchronized to EUV flashes.

The pellicle membrane may be biased relative to one or more of: a reticle masking unit, a reticle, a UNICOM or any other electrode within a reticle mini-environment, including an auxiliary grounded electrode.

The assembly may include a reticle masking unit, the reticle masking unit comprising first and second blades, wherein an electrical bias is provided between the first and the second blades, or between the blades and a grounded vacuum vessel. UNICOM may be biased. Y-nozzle may be biased. The (floating) pellicle may follow the bias of the blades, or Y-nozzle due to extraction of photoelectrons or via capacitive coupling.

At least one auxiliary grounded electrode may be provided. The grounded electrode prevents field lines from extending too far and can therefore prevent sparking within the lithographic apparatus, which may damage components within the apparatus, such as the pellicle.

According to a fifth aspect of the present invention, there is provided a pellicle apparatus for a lithographic apparatus, wherein said pellicle apparatus include a pellicle membrane and a pellicle heating means.

It will be understood that in normal operation of an EUV lithographic apparatus, a pellicle membrane will be heated by the EUV radiation beam. The present invention provides a heating means which is in addition to the heating which is provided by the EUV radiation or other radiation which is intended for lithography.

As described herein, etching of carbon based pellicle membranes is a two-factor process requiring both hydrogen ions and hydrogen radicals. The hydrogen ions are of sufficient energy to break carbon-carbon bonds within the pellicle membrane and the broken carbon-carbon bonds can then be passivated by adsorbed hydrogen radicals. Previously, pellicles were designed and engineered to reduce the operating temperature of the pellicle membrane in order to try to extend the lifespan of the pellicle membrane. As part of this, additional emissive layers were added to the pellicle to increase the emissivity of the pellicle and thereby reduce the operating temperature of the pellicle membrane at a given power. Contrary to this, it has been surprisingly found that heating the pellicle material can extend the operating lifetime of a pellicle, particularly a carbon-based pellicle, such as a carbon nanotube pellicle. Without wishing to be bound by scientific theory, it is believed that the concentration of adsorbed atomic hydrogen can be significantly reduced by increasing the temperature of the pellicle membrane. Since the adsorption of hydrogen onto a graphene-type structure, such as the surface of carbon nanotubes, is exothermic (typical for any condensation-like process), heating up of the pellicle membrane results in a lower amount of adsorbed atomic hydrogen (which can be treated as an evaporation-like process). It is estimated that the concentration of adsorbed atomic hydrogen at 300 K (approximately room temperature) is many orders of magnitude (around $10^9$) greater than the concentration of adsorbed atomic hydrogen at 1300 K provided the flux/concentration of H* near pellicle is kept constant. By reducing the concentration of adsorbed atomic hydrogen, the likelihood of a broken carbon-carbon bond being passivated is reduced and the etch rate of the pellicle is also reduced.

The heating means may be configured to heat a predetermined portion of the pellicle membrane. As mentioned, etching is caused by hydrogen radicals and hydrogen ions. In the reticle mini-environment of a lithographic apparatus, which is the area surrounding the pellicle, the radiation beam to be used for lithography, typically an EUV radiation beam, generates hydrogen ions and radicals. The ions recombine after a single collision with a wall of the apparatus, whereas the radicals do not recombine as readily and are therefore able to propagate further than the ions. Since it is the ions which are believed to be the major cause of carbon-carbon bond cleavage, it is advantageous to decrease the concentration of adsorbed atomic hydrogen in the areas of the pellicle membrane where the ions interact with the pellicle membrane. Since this is not the entirety of the pellicle membrane, the additional heating can be provided just to a selected portion of the pellicle membrane.

The predetermined portion of the pellicle membrane may be the portion which is subject to the highest hydrogen ion flux. As mentioned, since it is believed that etching is a two-factor process, the heating of the pellicle in the area which is subject to the highest ion flux reduces the concentration of adsorbed atomic hydrogen in the heated region and therefore reduces the etch rate of the pellicle membrane. Whilst it will be appreciated that it is most important to heat the pellicle membrane where both atomic hydrogen and hydrogen ions are present, it is of course possible to heat a greater proportion or even all of the pellicle membrane.

The heating means may include one or more lasers. The lasers may operate in the visible or infrared spectrum. Indeed any frequency that results in heating of the pellicle membrane may be used. Any number of laser beams may be used. The laser beams may be directed to the area of the pellicle membrane to be heated. There may be one or more optical elements which directed the laser light towards the pellicle membrane. The one or more optical elements may reflect, refract, or diffract incoming laser light onto the pellicle membrane. The one or more optical elements may be on a reticle masking unit blade. It is preferably that the laser light is in the visible and/or IR region as light of such wavelengths is already present in the lithographic apparatus and so no light having "new" wavelengths which would have to be accounted for is introduced into the apparatus. Another benefit of using VIS or IR radiation is that they do not develop resists and so to some extent their scattering towards the substrate can be tolerated.

The heating means may include one or more resistive heating elements. Resistive heating elements rely on the passage of electrical current through a material. Since the pellicle membrane preferably includes carbon nanotubes, these carbon nanotubes may serve as the resistive heating elements. As such, a current source can be attached to the pellicle membrane and the current passing through the membrane will cause it to heat up and drive off adsorbed atomic hydrogen.

Conductive strips may be provided to distribute the current across at least a portion of the pellicle membrane. Carbon nanotubes are highly conductive along their lengths and there is a higher electrical resistance between adjacent nanotubes. As such, in order for the current to be more efficiently distributed across the pellicle membrane, a conductive strip may be provided which distributes the current across the pellicle membrane. In contrast, a single electrical connection to the pellicle membrane could result in an uneven distribution of current. It will be appreciated that the conductive strip may be configured to direct current flow in certain portions of the pellicle membrane, preferably portions which are subject to the highest hydrogen ion flux.

The pellicle membrane preferably comprises carbon nanotubes. Preferably, the pellicle membrane is a pellicle membrane according to any aspect of the present invention. Carbon nanotubes are able to withstand temperatures of over 1000° C. or more and so are not damaged by increased temperatures. In addition, the pellicle membranes according to the present invention may also be configured to increase the recombination rate of adsorbed atomic hydrogen and so the additional heating of the pellicle membrane can be used in combination to further reduce the etch rate of the pellicle membrane. In addition, the methods and apparatus for reducing hydrogen ion flux may also be used in combination with the heated pellicle and/or the pellicle comprising nanoparticles.

According to a sixth aspect of the present invention, there is provided a method of extending the operational lifetime of a pellicle membrane, the method including selectively heating an area of the pellicle membrane.

Similar considerations apply to the sixth aspect as apply to the fifth aspect of the present invention. The heating of an area of the pellicle membrane reduces the concentration of adsorbed atomic hydrogen and thereby reduces the etch rate of the pellicle membrane. It will be appreciated that the pellicle membrane will be heated by the (EUV) light used in the lithography itself and that the heating described herein is in addition to the normal heating.

The method may include heating the area of the pellicle membrane which is subject to the highest hydrogen ion flux during operation. Whilst it is possible to heat the whole of the pellicle membrane, it is most important to heat the area of the pellicle membrane which is subject to the highest hydrogen ion flux as that is where most etching takes place.

The heating may be effected (put into effect) by directing a laser beam onto the pellicle membrane. The laser beam is preferably in the visible or IR region. Laser beams are advantageous as their power can be readily adjusted and it is possible to precisely direct the laser light onto the desired area of the pellicle membrane.

The laser light may be directed by one or more optical elements. Since it may not be possible to directly fire a laser at the pellicle membrane, optical elements may be provided which direct the laser light onto the desired area of the pellicle membrane.

Alternatively or additionally, the additional heating may be effected (put into effect) or otherwise provided by passing a current through the pellicle membrane. A current will cause the pellicle membrane to heat up and reduce the concentration of adsorbed atomic hydrogen. The current can be varied to provide different amounts of additional heating. The current can also be provided to selected portions of the pellicle membrane to cause heating in the area which is subject to the highest hydrogen ion flux.

The pellicle membrane used in this aspect of the present invention can be the pellicle membrane described in any aspect of the present invention. In addition, the method of the sixth aspect can be combined with the apparatus and methods of any other aspect described herein.

According to a seventh aspect of the present invention, there is provided a pellicle membrane for a lithographic apparatus, said membrane comprising a network of non-aligned nanotubes.

Non-aligned nanotubes may also be referred to as randomly-aligned nanotubes. A network of random nanotubes has a porosity. Porosity lowers EUV absorption and thereby raises EUV transmission, which results in higher scanner throughput. The porosity also prevents the build-up of a pressure difference between the two sides of the pellicle. As such, the pellicle deflects less during venting and pumping actions, which reduces the risk of pellicle damage or failure. In addition, the mass distribution over the in-plane surface of such a non-aligned network is very uniform, which is useful in avoiding imaging artefacts. In addition, in the event of a ballistic particle f sufficient momentum colliding with the membrane, in a randomly aligned network, any crack propagation is halted after travelling a typical dimension of a pore, which may be around 100 nm, and the membrane stays intact.

The network may comprise a three-dimensional porous network.

The nanotubes may be single-walled, double-walled, multi-walled, and/or co-axial. Co-axial nanotubes are composite nanotubes with one nanotube disposed within another nanotube. The inner or core nanotube may be the same as or different to the outer or capping nanotube. Double-walled carbon nanotubes and multi-walled nanotubes are emissive and single-walled nanotubes may be emissive depending on their chirality. Being emissive may help to reduce the operating temperature of the pellicle.

The pellicle membrane may comprise a single type of nanotube or two or more types of nanotube. As such, the pellicle membrane according to the present invention may be homogenous, that is to say that all of the nanotubes are made from the same material. The pellicle membrane may be heterogenous, that is to say that different types of nanotubes may be used to form the pellicle membrane. By forming the pellicle membrane of a single type of nanotube, the physical properties of the membrane are uniform. By forming the pellicle membrane of two of more types of nanotube may benefit from having certain different properties of each of the materials, such as etch resistance and strength.

The membrane may comprise carbon, boron nitride, and/or transition metal chalcogenides. Each of these materials is able to form nanotubes from which the membrane may be made. Carbon nanotubes are stable up to high temperatures well in excess of the operating temperature of existing pellicles. Boron nitride nanotubes are also thermos-mechanically stable at the temperatures faced by a pellicle within an EUV lithography apparatus, and are also oxidation resistant up to around 900°. Boron nitride nanotubes are also electrically insulating and can be readily synthesized by known methods, such as arc discharge, chemical vapour deposition, and laser ablation.

The transition metal may be selected from Mo, W, Sb, or Bi. As such, the transition metal (TM) may be Mo. The TM may be W. The TM may be Sb. The TM may be Bi.

The chalcogenide may be selected from S, Se, or Te. As such, the chalcogenide may be S. The chalcogenide may be Se. The chalcogenide may be Te.

For example, the transition metal chalcogenide may be tungsten disulphide or antimony telluride.

At least some of the nanotubes may include a capping material. The capping material may be selected from a metal oxide, silicon oxide, and hexagonal boron nitride. Such capping materials may serve to protect the nanotubes from damage. The damage may occur by oxidation or reduction. For example, where the nanotubes are carbon nanotubes, they may be susceptible to attack by hydrogen ions and radicals. A capping material may be resistant to such hydrogen-etching and therefore extend the life of the pellicle. It is important that the coefficient of thermal expansion of the core material and the capping material are similar to avoid thermal stresses being introduced as the temperature increases during operation. Thermal stability of the capping layer, resistance to oxidation and hydrogen induced outgassing are also important considerations when selecting a capping layer. Silicon oxide may be particularly suitable for carbon nanotubes and boron nitride nanotubes. Hexagonal boron nitride may be particularly suitable for carbon nanotubes.

The metal of the metal oxide may be selected from aluminium, zirconium, yttrium, tungsten, titanium, molybdenum, and hafnium. These metal oxides have been found to have the appropriate physical and chemical properties to serve as a capping layer for nanotubes, in particular carbon nanotubes and boron nitride nanotubes.

Hexagonal boron nitride and dialuminiumtrioxide may be of specific use as capping materials. The aluminium oxide may be in the alpha phase. Although aluminium oxide may absorb EUV light due to the presence of oxygen, it is resistant to further oxidation (being already in its oxidised state) and is also resistant to reduction. It can also be applied with good conformity to the material on which it is deposited. It may be deposited at modest temperatures of around 150-350° C., where it is deposited in an amorphous state. The amorphous aluminium oxide may subsequently be annealed at a temperature of about 1115° to crystallize into the corundum (alpha) state. Annealing may also decrease the number of defects in the pellicle membrane.

The pellicle membrane may comprise coaxial nanotubes. The coaxial nanotubes may comprise a carbon-nanotube core within a hydrogen-resistant nanotube. By having one nanotube inside another, they experience lower thermos-mechanical stresses caused by heating. Since the outer nanotube is not or is only weakly connected to the inner nanotube, it is possible to use a wider variety of materials, even ones which have very different coefficients of thermal expansion. As such, the inner nanotube may be selected for strength and the outer nanotube may be selected for etch-resistance. In this way, a pellicle membrane comprising such coaxial nanotubes may display high strength as well as high chemical stability. As such, any capping material which is capable of forming nanotubes and which is resistant to the environment of an operating EUV lithography apparatus may be used.

The coaxial nanotube may comprise a boron nitride nanotube, molybdenum disulphide or tungsten sulphide shell surrounding a carbon-nanotube core. The carbon-nanotube core is very strong and is able to withstand very high temperatures. The outer nanotube material is resistant to the environment of the operating EUV lithography apparatus, particularly to hydrogen etching. As such, the pellicle membrane comprising such coaxial nanotubes is strong whilst also being resistant to hydrogen etching.

According to an eight aspect of the present invention, there is provided a lithographic apparatus according to the first, fourth, fifth, seventh, or ninth aspects of the present invention.

According to a ninth aspect of the present invention, there is provided a method of conditioning a carbon nanotube pellicle membrane, said method including selectively removing nanoparticle contamination and/or amorphous carbon from the pellicle membrane by heating the pellicle membrane with electromagnetic radiation, wherein the conditioning takes place outside a lithography apparatus.

Carbon nanotube (CNT) membranes may contain metal-containing nanoparticles that were employed as catalysts during synthesis of the CNTs. Such nanoparticles or remnants thereof which are present in CNT membranes may causes EUV transmission losses and may also introduce the risk of reticle contamination. Usually, gaseous etching species are present during CNT synthesis to reduce the catalyst nanoparticles to their metallic state to enhance catalytic activity. The gaseous etching species is usually derived from hydrogen or ammonia. The etching species also etches some amorphous carbon which is formed. Nevertheless, once the CNT synthesis is complete, there may still be some amorphous carbon which remains, which may result in dangling bonds or missing atoms in the structure. It is desirable to remove any amorphous carbon which remains as well as the catalyst nanoparticles. The catalyst nanoparticles may comprise iron, iron oxides, cobalt, nickel, chromium, molybdenum and/or palladium.

Irradiating the carbon nanotube pellicle membrane with electromagnetic radiation causes the pellicle to heat up. Due to the higher absorbance of a metallic particle compared to the extremely low absorbance of the thin CNT membrane, the immediate vicinity of the metallic nanoparticle contaminants as well as the metallic nanoparticle contaminants themselves heat up during irradiation. This has been found to remove metallic nanoparticle contaminants from the pellicle membrane. This conditioning step takes place outside of the lithographic apparatus and before use as a pellicle in order to avoid potentially contaminating the inside of the lithographic apparatus.

The CNT pellicle membrane may be heated in a vacuum or in a reducing environment. In order to avoid oxidation of the carbon nanotubes, the heating may be conducted within a vacuum. In embodiments which utilise a reducing environment, the metal-containing nanoparticle contaminants, which may include iron oxides, are reduced to their metallic form. In addition, any remaining amorphous carbon is removed. Furthermore, the crystallinity of the CNTs is increased.

The reducing environment may be a hydrogen environment Ammonia may additionally or alternatively be used to create a reducing environment.

In other embodiments, gases which react with the metallic catalyst nanoparticles may be used. For example, carbon oxides, oxygen or other suitable gases may react with the metallic catalyst to form volatile compounds under low-energy light irradiation. Carbon oxides, possibly formed by reacting oxygen with carbon in the membrane, may bind to the metal to form metal carbonyls which are then able to be removed by light-induced excitation. In addition, amorphous carbon may be removed as carbon oxide, in a similar way to the removal of amorphous carbon as hydrocarbons in a reducing environment.

Any wavelength of light which may be absorbed by metallic nanoparticles causing them to heat up may be used. For example, an infrared or near-infrared wavelength, such as 810 nm, may be used. The wavelength of light used may be from around 700 nm to round 1000 nm. Such wavelengths of light are readily provided and are safe and easy to use.

The CNT pellicle membrane may be heated for any suitable time. A suitable time is one in which more than 50% of the metal-containing nanoparticle contaminants are removed. In embodiments, a suitable time is one in which more than 60%, more than 70%, more than 80%, or more than 90% of nanoparticle contaminants are removed. The number of metallic contaminants may readily be determined by way of scanning electron microscopy, such that the length of time required to remove the desired proportion of the metallic nanoparticles can be determined routinely.

The CNT membrane may be heated for up to 10 minutes, for up to five minutes or for up to two minutes. The CNT membrane may be heated for 15 s, for 30 s, for 45 s, for 60 s, for 75 s, or for 90 s.

The electromagnetic radiation used in the heating of the pellicle membrane may be low-power. As such, the power may be less than 20 $W/cm^2$, less than 15 $W/cm^2$, less than 10 $W/cm^2$, or less than 5 $W/cm^2$. The power may be around 3 $W/cm^2$, 2 $W/cm^2$, 1 $W/cm^2$, or 0.5 $W/cm^2$. Such low-powers allow the nanoparticles and/or amorphous carbon to be removed whilst also avoiding the risk of causing damage to the pellicle membrane.

It will be appreciated that features described in respect of one embodiment may be combined with any features described in respect of another embodiment and all such combinations are expressly considered and disclosed herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
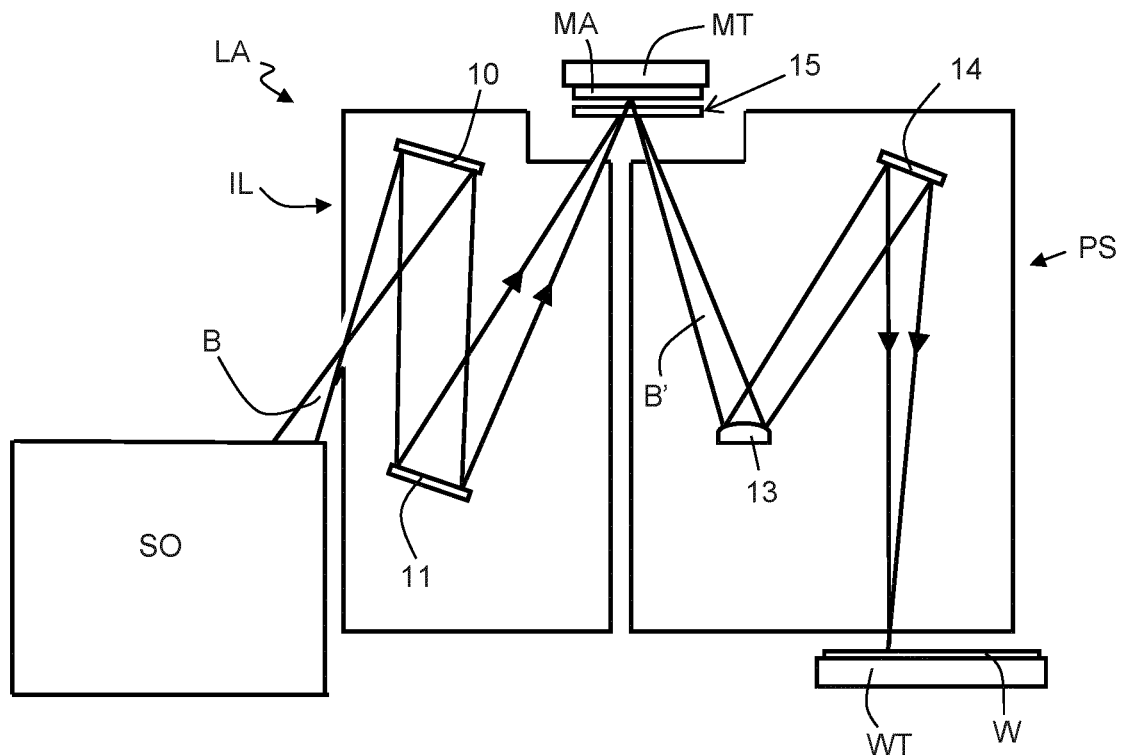
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 shows a lithographic system including a pellicle 15 (also referred to as a membrane assembly) according to the present invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W. In this embodiment, the pellicle 15 is depicted in the path of the radiation and protecting the patterning device MA. It will be appreciated that the pellicle 15 may be located in any required position and may be used to protect any of the mirrors in the lithographic apparatus.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source. A laser, which may for example be a $CO_2$ laser, is arranged to deposit energy via a laser beam into a fuel, such as tin (Sn) which is provided from a fuel emitter. Although tin is referred to in the following description, any suitable fuel may be used. The fuel may for example be in liquid form, and may for example be a metal or alloy. The fuel emitter may comprise a nozzle configured to direct tin, e.g. in the form of droplets, along a trajectory towards a plasma formation region. The laser beam is incident upon the tin at the plasma formation region. The deposition of laser energy into the tin creates a plasma at the plasma formation region. Radiation, including EUV radiation, is emitted from the plasma during de-excitation and recombination of ions of the plasma.

The EUV radiation is collected and focused by a near normal incidence radiation collector (sometimes referred to more generally as a normal incidence radiation collector). The collector may have a multilayer structure which is arranged to reflect EUV radiation (e.g. EUV radiation having a desired wavelength such as 13.5 nm). The collector may have an elliptical configuration, having two ellipse focal points. A first focal point may be at the plasma formation region, and a second focal point may be at an intermediate focus, as discussed below.

The laser may be separated from the radiation source SO. Where this is the case, the laser beam may be passed from the laser to the radiation source SO with the aid of a beam delivery system (not shown) comprising, for example, suitable directing mirrors and/or a beam expander, and/or other optics. The laser and the radiation source SO may together be considered to be a radiation system.

Radiation that is reflected by the collector forms a radiation beam B. The radiation beam B is focused at a point to form an image of the plasma formation region, which acts as a virtual radiation source for the illumination system IL. The point at which the radiation beam B is focused may be referred to as the intermediate focus. The radiation source SO is arranged such that the intermediate focus is located at or near to an opening in an enclosing structure of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil minor device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other minors or devices in addition to or instead of the faceted field mirror device 10 and faceted pupil mirror device 11.

Following reflection from the patterning device MA the patterned radiation beam B enters the projection system PS. The projection system comprises a plurality of minors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of minors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

In an embodiment the membrane assembly 15 is a pellicle for the patterning device MA for EUV lithography. The membrane assembly 15 of the present invention can be used for a dynamic gas lock or for a pellicle or for another purpose. In an embodiment the membrane assembly 15 comprises a membrane formed from the at least one membrane layer configured to transmit at least 90% of incident EUV radiation. In order to ensure maximized EUV transmission and minimized impact on imaging performance it is preferred that the membrane is only supported at the border.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time.

Figure 2:
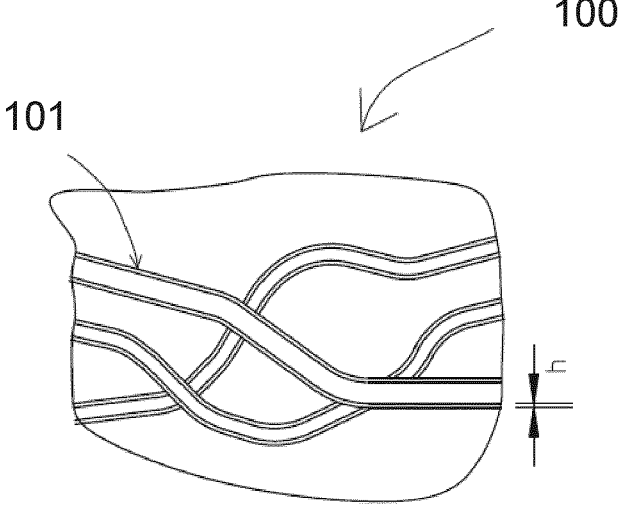
FIG. 2 depicts a schematic of a prior art pellicle membrane comprising a bundle of carbon nanotubes comprising a capping layer.

FIG. 2 is a schematic depiction of a bundle of carbon nanotubes 100 in which the carbon nanotubes comprise a capping layer 101. The typical diameter of the carbon nanotubes is from around 2 to around 30 nm and the thickness h of the capping layer 101 is generally less than around 10 nm, typically around 1 nm. Despite the capping layer being very thin, the transmissivity of a pellicle membrane comprising a conformal coating is reduced compared with a pellicle membrane comprising uncapped nanotubes. In addition, as mentioned above, a thin layer may be prone to dewetting. In addition, as mentioned above capping of nanotubes may render pellicle EUV scattering intolerable. The bundle of nanotubes may comprise a pellicle membrane. The pellicle membrane may be attached to a frame which supports the pellicle membrane.

Figures 3A, 3B:
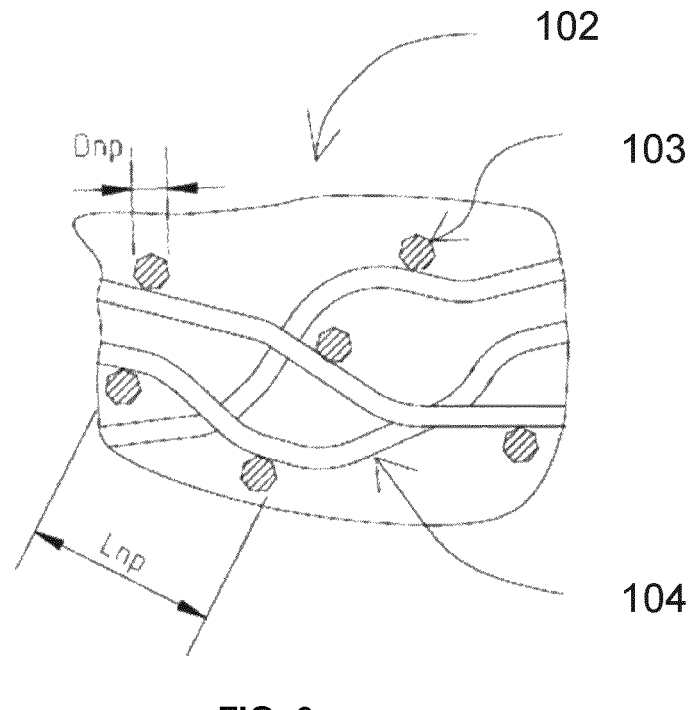
FIGS. 3a and b depict a schematic of a pellicle membrane according to the present invention.

FIG. 3_a_ is a schematic depiction of a bundle of carbon nanotubes 102 according to an embodiment of the present invention in which the outer surface of the carbon nanotubes is decorated with nanoparticles 103. The diameter of the nanoparticles is indicated as $D_{np}$. The diameter of the nanoparticles may be measured by any suitable method. Preferably, the diameter is measured by TEM (Transmission Electron Microscopy). The nanoparticles may range in diameter from a maximum diameter to a minimum diameter. The sizes of the particles does not necessarily have to be the same, but it is preferable that the nanoparticles are within a narrow size range. Narrow size ranges may include ±15 nm, ±10 nm or ±5 nm. It will be appreciated that due to manufacturing limitations, some nanoparticles may be outside of tolerances. The term $L_{np}$ is used to indicate the distance between adjacent or neighbouring nanoparticles. It will be appreciated that this could be a nanoparticle on the same nanotube or a nanoparticle on a different nanotube.

FIG. 3_b_ schematically depicts how the carbon nanotube may be eroded by the presence of adsorbed atomic hydrogen and the breaking of carbon-carbon bonds by hydrogen ions. The hydrogen radicals H* are able to adsorb to the surface of the carbon nanotubes and migrate along the nanotube until they arrive at a nanoparticle. Since the rate of recombination of hydrogen radicals into molecular hydrogen is faster at the nanoparticle than at the carbon nanotube, there is a greater rate of molecular hydrogen production at the nanoparticle than elsewhere on the carbon nanotube, so adsorbed atomic hydrogen is removed and so the concentration of adsorbed atomic hydrogen is removed making it less likely that a broken carbon-carbon bond would be passivated. In contrast, in the areas which are not protected by a nanoparticle, adsorbed hydrogen radicals are not recombined as readily and so when a carbon-carbon bond is broken by a hydrogen ion, this can result in passivation of the bond and ultimately release of hydrocarbon from the nanotube resulting in damage to the nanotube.

Figures 4A, 4B:
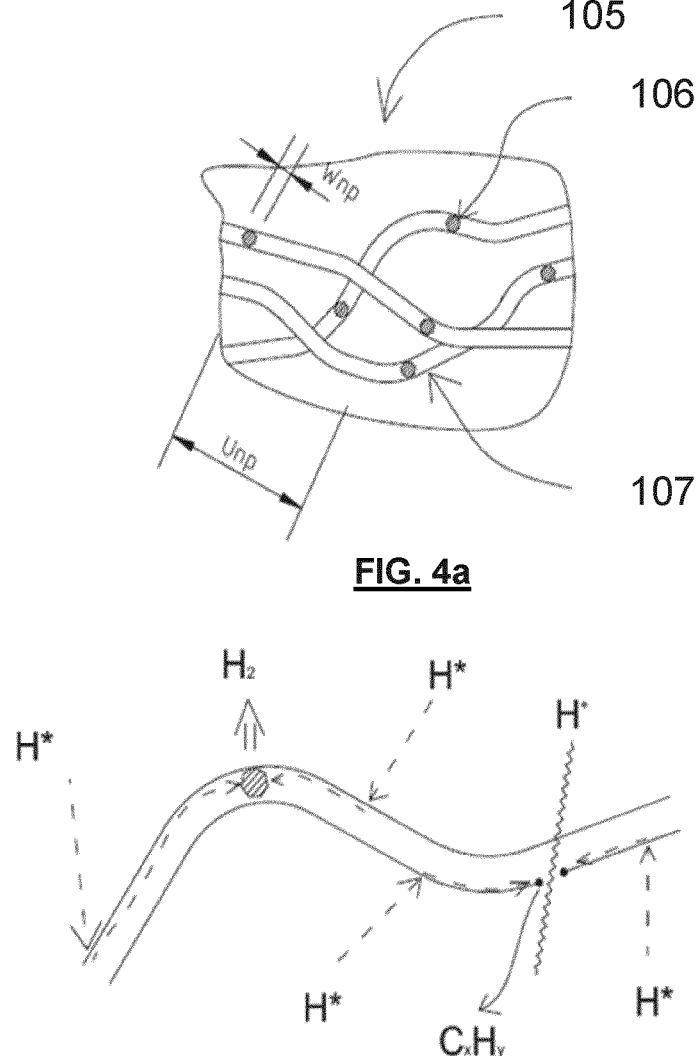
FIGS. 4a and b depict a schematic of a pellicle membrane according to the present invention.

FIGS. 4_a_ and 4_b_ depict an embodiment similar to that of FIGS. 3_a_ and 3_b_, but in which the nanoparticles are disposed within the nanotubes. As with FIGS. 3_a_ and 3_b_, depicted is a bundle 105 of carbon nanotubes 107 in which the nanoparticles 106 are within the carbon nanotubes. It will be appreciated that some embodiments may have nanoparticles disposed on both the inside and outside of the nanotubes. $W_{np}$ is the diameter of the nanoparticles and $U_{np}$ is the distance between adjacent or neighbouring nanoparticles. As with FIG. 3_b_, adsorbed atomic hydrogen is able to migrate along the nanotubes where it is recombined into molecular hydrogen and is then able to desorb from the nanotube. Despite being inside the nanotube, the nanoparticle still increases the recombination of atomic hydrogen and thereby protects the nanotube from etching.

Figure 5:
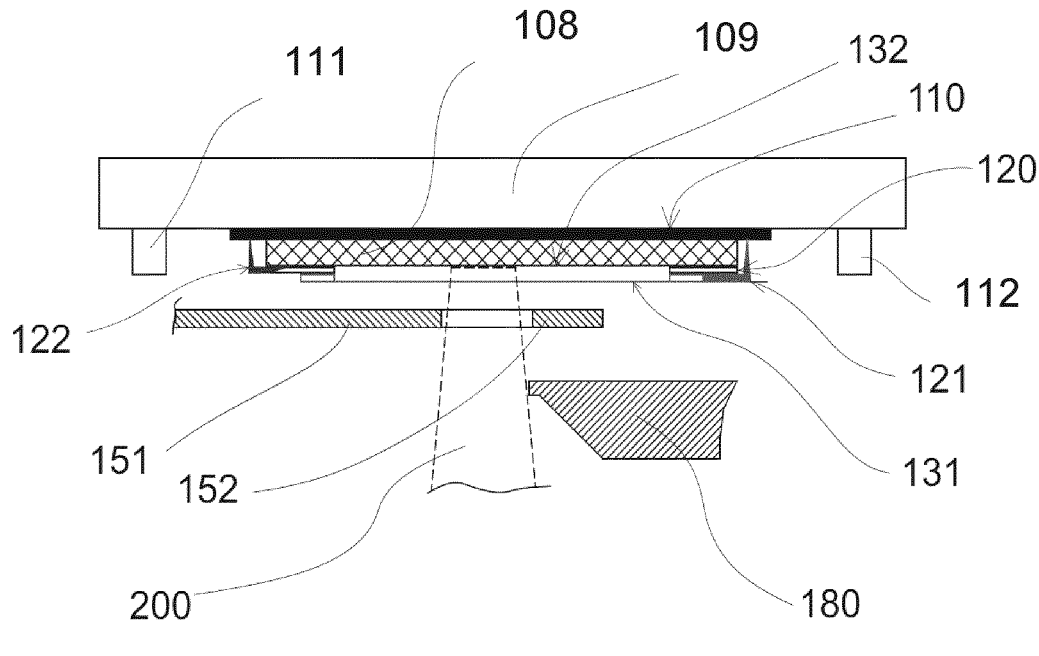
FIG. 5 depicts a schematic of a lithographic apparatus including an electrically biased pellicle/reticle.

FIG. 5 depicts a patterned reticle 108 mounted on a chuck 109 by clamp 110 with fiducial markers 111 and 112. The reticle 108 is covered by pellicle 131. It will be appreciated that the pellicle may be a pellicle according to the present invention or another type of pellicle. The pellicle 131 may be connected to the reticle via an optional insulating structure 120 to form a floating pellicle. The pellicle 131 is connected to a biased electrode via connector 121. The reticle front side quality area 132 is connected to the other biased electrode via connector 122. Reticle masking blades (REMA blades) 151 and 152 and uniformity correction module (UNICOM) 180 define the illumination of the reticle 108 with EUV radiation 200. It will be appreciated that the REMA blades and UNICOM are used in practical EUV lithography apparatuses and are included for additional context. The invention may be practised without these features. The bias between the pellicle 131 and the reticle 108 deflects ions, which are created by ionizing gas between the pellicle 131 and the reticle 108 and/or delivered by diffusion through the pores of the pellicle 131 from the volume between the pellicle and the REMA blades 151, 152, and away from the pellicle 131 towards the reticle 108. This reduces the etching of the pellicle membrane, which may be a carbon nanotube pellicle membrane.

Figure 6:
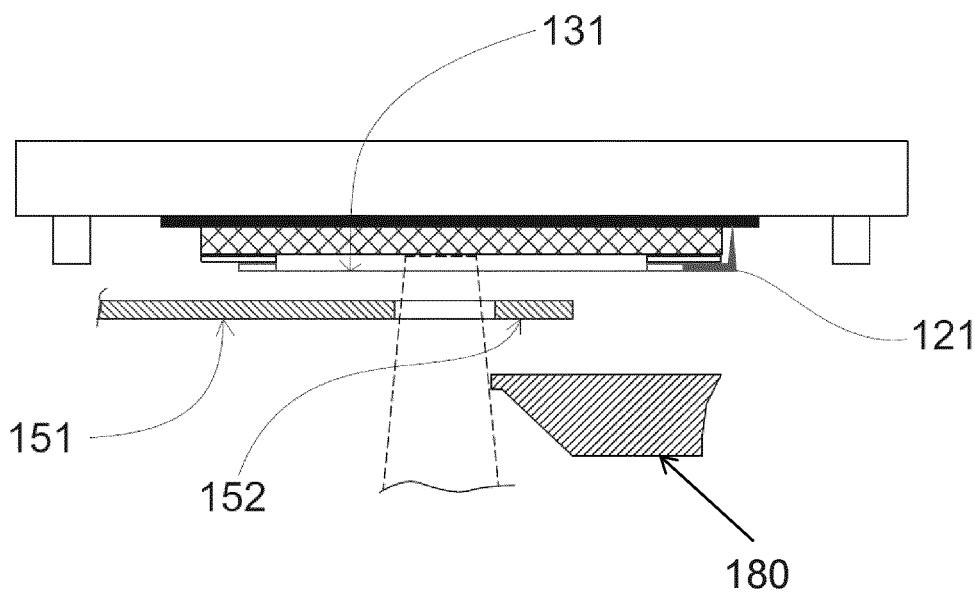
FIG. 6 depicts a schematic of a lithographic apparatus including an electrically biased pellicle/reticle masking unit.

FIG. 6 depicts an arrangement in which the electrical bias is provided between the pellicle 131 and the REMA blades 151, 152, UNICOM 180 may as well be provided with similar or comparable potential as the REMA blades. As with the arrangement of FIG. 5, the pellicle 131 is connected to an electrode via connector 121. Optionally, the pellicle may be left floating, and so connector 121 may be omitted. The REMA blades 151, 152 potential is negative. In use, the bias may be introduced not only between pellicle and an electrode, but also between EUV plasma itself (mostly contained within EUV cone) and an electrode. Typically, plasma potential is somewhat positive (+5 . . . +25 V) with respect to the largest nearest electrode (which, is generally a grounded vacuum vessel wall), thus, by introducing absolute negative potential electrodes (for example REMA blades or UNICOM or Y nozzle) it is possible to extract positive ions from the plasma and redirect them away from the (floating or biased) pellicle.

Figures 7A, 7B:
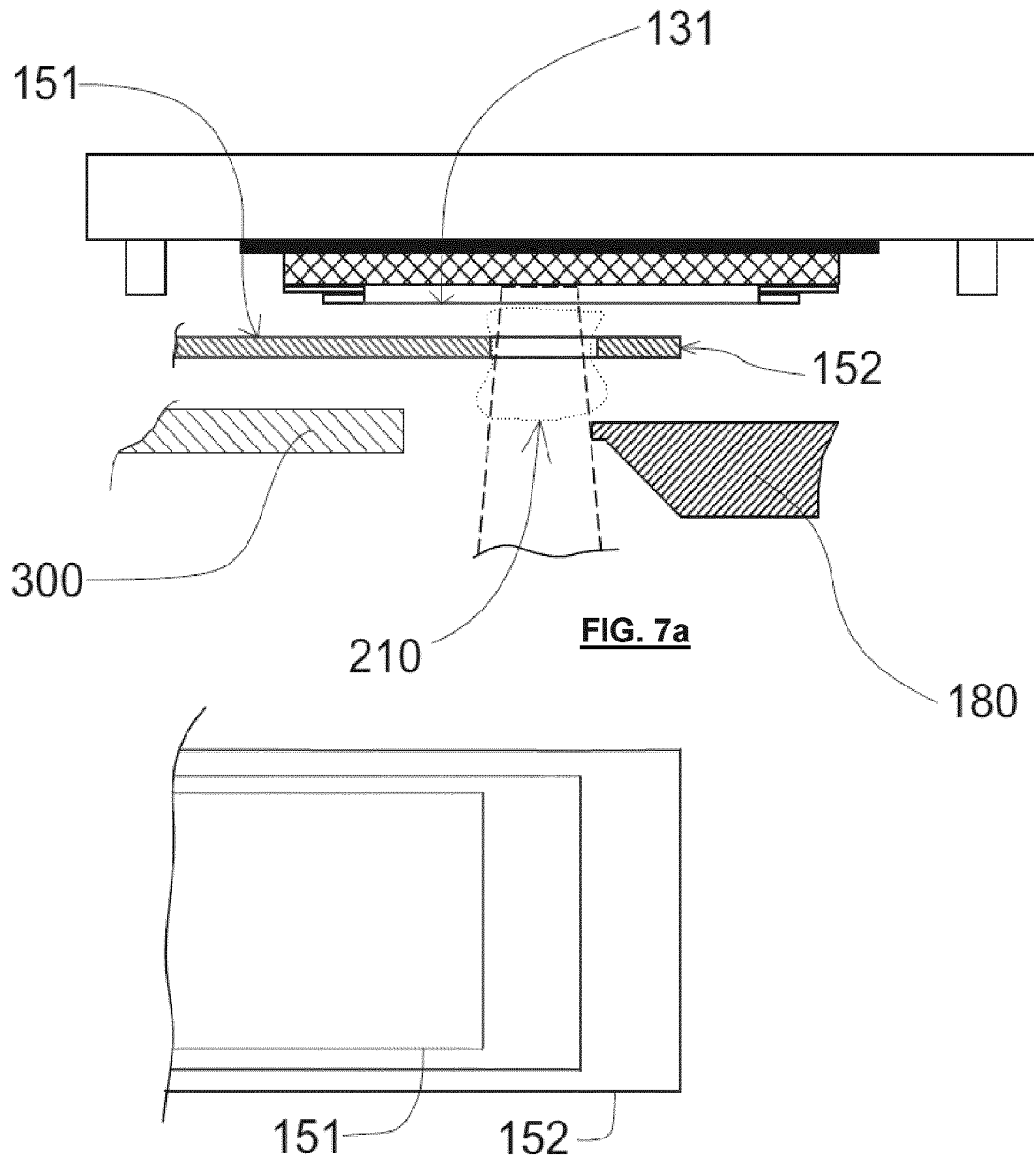
FIGS. 7a and b depict a schematic of a lithographic apparatus including electrically biased reticle masking unit blades.

FIGS. 7a and 7b depict an arrangement in which the electrical bias is provided between the REMA blades 151, 152. As most clearly seen in FIG. 7b, there is a larger REMA blade 151 and a smaller REMA blade 152. Preferably, the larger REMA blade 151 is less negatively biased than the small REMA blade 152 relative to the grounded vacuum vessel in order to reduce possible capacitive (negative) biasing of the floating pellicle.

Figure 8:
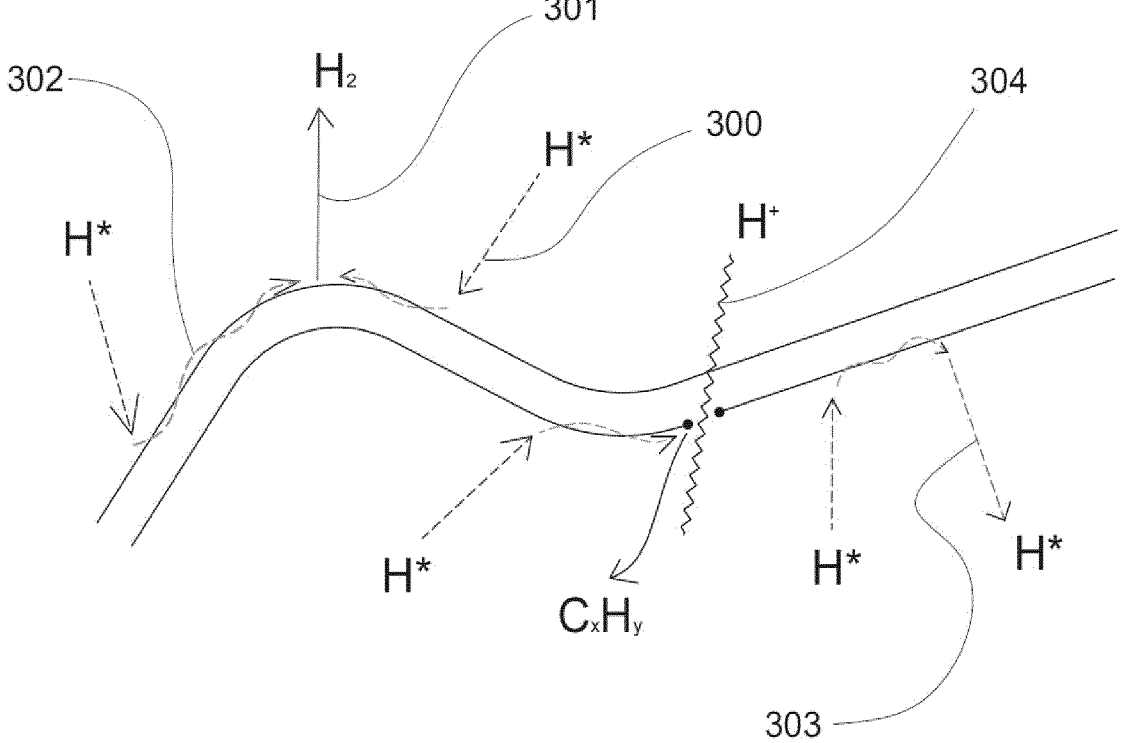
FIG. 8 depicts a schematic of the major processes involved in the etching of a carbon nanotube pellicle membrane.

FIG. 8 depicts the major processes involved in the etching of carbon nanotubes. Arrow 301 depicts the removal of adsorbed atomic hydrogen by associative desorption of $H_2$. The transfer of adsorbed atomic hydrogen (also known as hydrogen radical hopping) is shown by arrow 302. The adsorption of hydrogen radicals is depicted as arrow 300 and the desorption of hydrogen radicals is depicted by arrow 303. The cleavage of carbon-carbon bonds by hydrogen ions is depicted by line 304. Of the various processes depicted, hydrogen radical desorption 303 has the largest associated energy barrier, with the other processes having lower energy barriers. As such, by heating up the pellicle, the process with the highest energy barrier, namely atomic hydrogen desorption is accelerated the most. As such, whilst all processes may be accelerated, the desorption of atomic hydrogen is accelerated more than the other processes. In addition, process 304 which involves hydrogen ions is related to the energy of the incoming hydrogen ion, and so is less (or not at all) dependent on pellicle temperature.

Figure 9:
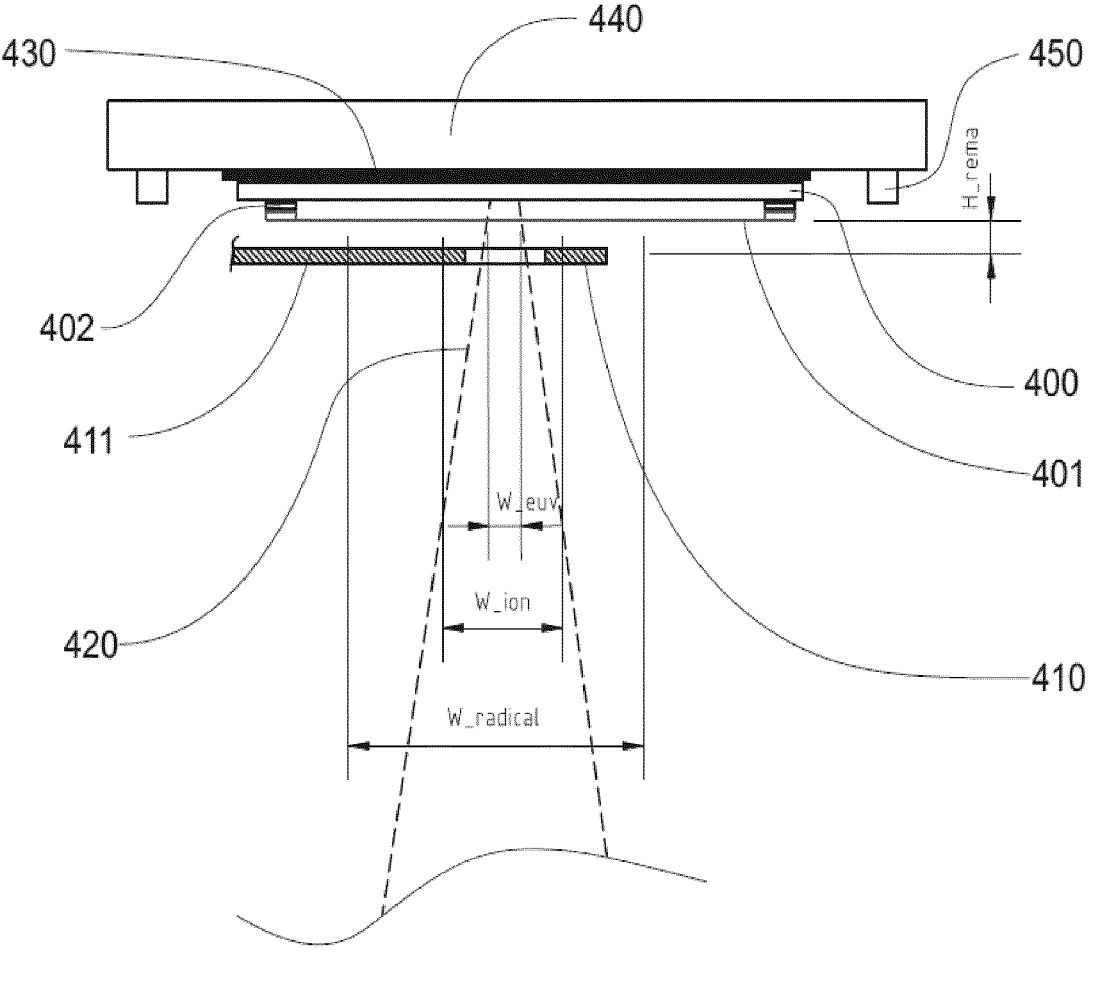
FIG. 9 depicts the reticle mini-environment and the approximate extent of the EUV radiation, hydrogen ions and hydrogen radicals.

FIG. 9 depicts the reticle mini-environment (RME) which surrounds the reticle 430 and shows the approximate extent of the EUV radiation beam (W_EUV), the extent of the main hydrogen ion flux (W_ion), and the width of the main hydrogen radical flux (W_radical). It will be appreciated that the cones depicting these regions are for illustrative purposes and to assist in the understanding of the invention. The pellicle 401 is supported on a reticle 400 via optional flexures 402. The EUV cone 420 generates radicals and ions which have different reaches within the RME. Typically, the distance between reticle masking unit blades 411 and 410 is similar to the width of the EUV radiation beam (W_EUV). Typically, the hottest region of the pellicle is only slightly (for example a few millimetres) bigger than W_EUV due to the finite thermal conductivity of the porous carbon nanotube membrane. Since the hydrogen ions recombine after one collision with a surface, the reach of the ions W_ion is similar to W_EUV plus around 2 to 4 times the distance (H_rema) between the reticle masking unit blades and the pellicle 401. H_rema is typically around 2 to 5 mm. On the other hand, since radicals can survive multiple collisions with a surface, their reach (W_radical) is much greater and may be similar to the size of the pellicle. As such, the area which is subject to both ion and radical flux is not the whole of the surface of the pellicle. Consequently only this overlapping area may be heated in order to lower the concentration of adsorbed hydrogen radicals in order to slow etching.

Figure 10:
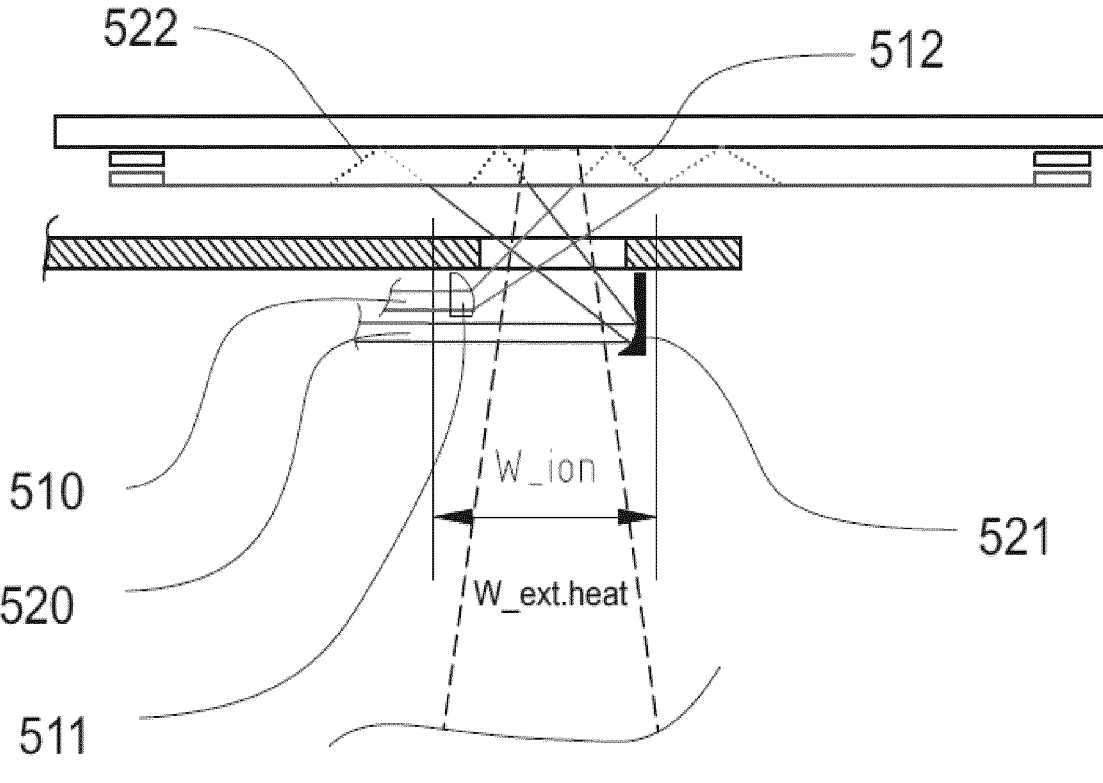
FIG. 10 depicts an embodiment of the present invention.
Figures 11A, 11B:
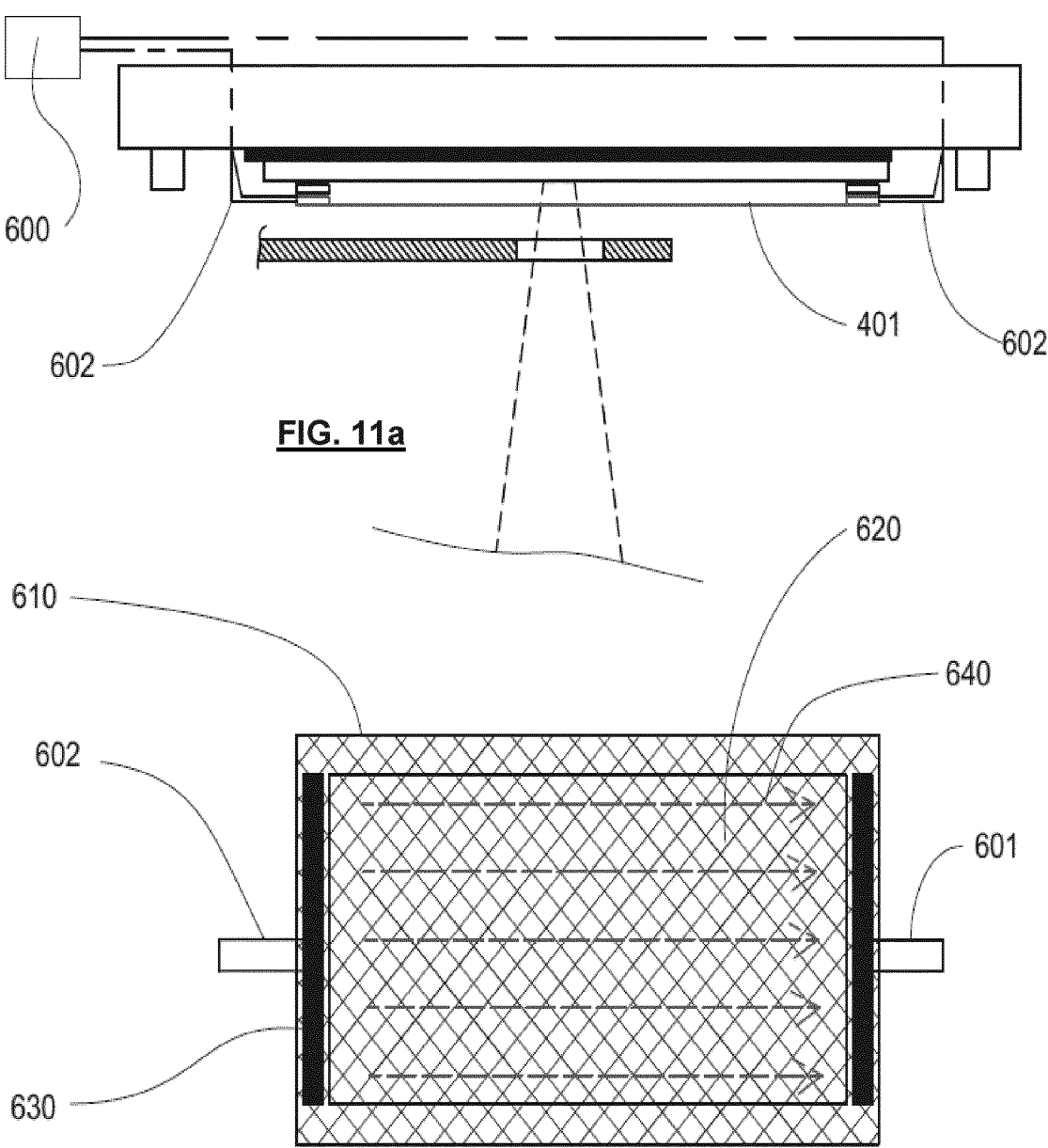
FIGS. 11a and 11b depict an embodiment of the present invention.

FIG. 10 depicts an embodiment of the invention in which lasers are used to supply additional heating to the pellicle membrane. As depicted, laser beams 510 and 520 are provided. It will be appreciated that the invention is not limited to only two laser beams and fewer or more can be used as required. In the depicted example, each laser beam has an associated optical element 510, 521 which directs the laser beam onto the pellicle. The width of the approximate additional heated region is shown as W_ext.heat. The heating effect of the laser light suppresses adsorbed radical concentration in the area of highest ion flux and thereby reduces the etch rate. The selective heating limits the overall thermal load to the reticle. Any suitable power of laser may be selected, for example it may be desirable to provide between 0.1 to 10 w/cm² of absorbed energy in order to provide the required additional heating. The transmitted radiation 512, 522 power (directed to the reticle) is estimated to be a fraction (for example around 5 to 50%) of the incident power and is almost fully reflected by the reticle in the same way as IR radiation from the hot pellicle, thus it is tolerable thermal load for the reticle FIGS. 11a and 11b depict an embodiment of the present invention which includes resistive heating. A current source 600 is connected to pellicle 401 via contacts 601, 602 and/or wires integrated into the chuck or the clamp. Current 640 within the pellicle film 620 can be made substantially uniform by the provision of high conductivity strips 630 on the pellicle frame 610 and the current provides to such strips. The conductive strips 630 can be configured to distribute the current to the portions of the pellicle membrane which is subject to the highest hydrogen ion flux.

Figure 12A:
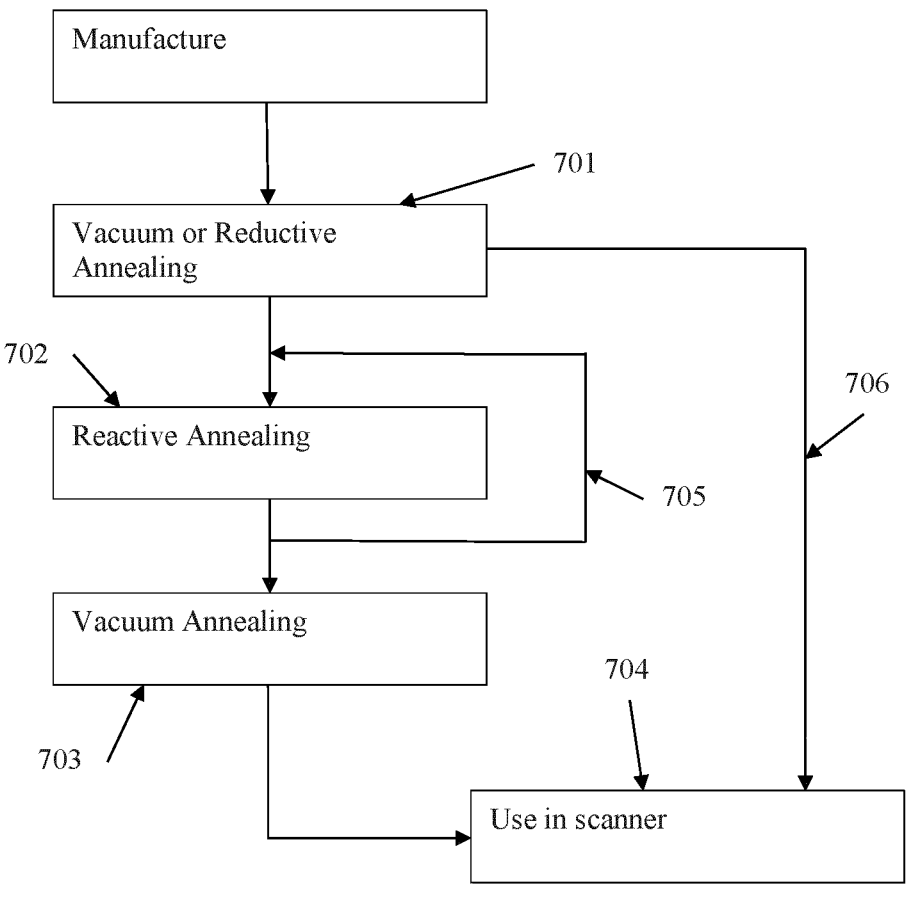
FIGS. 12a and 12b depict embodiments of methods according to the present invention.
Figure 12B:
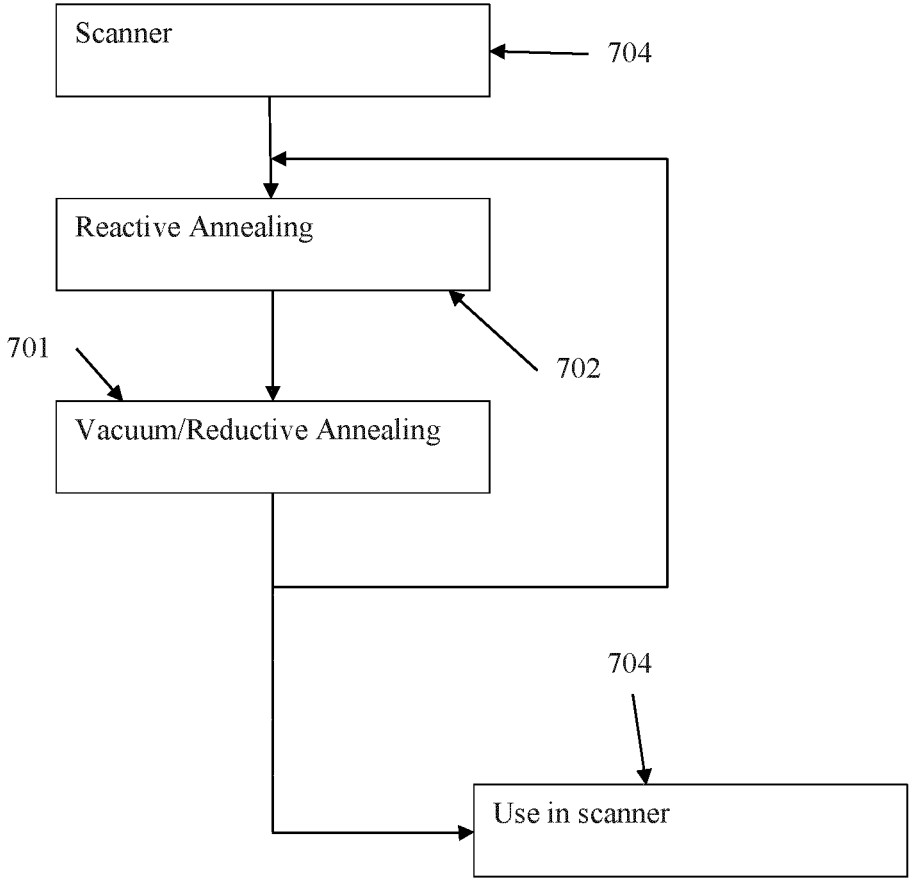

FIGS. 12a and 12b depict schematic flow charts relating to methods of regenerating, conditioning, and/or healing of pellicle membranes. Turning firstly to FIG. 12a, after manufacture, the pellicle membrane undergoes a vacuum or reductive annealing step 701. This removes any loosely bound and amorphous carbon and other contaminants, such as remaining seed nanoparticles from the carbon nanotube growth process. The pellicle membrane then undergoes a reactive annealing process 702 in a hydrocarbon-containing atmosphere. The hydrocarbon may be any hydrocarbon, although it is preferred to use a short-chain (C1-4) hydrocarbon, such as methane, ethane, propane, or butane. The Hydrocarbon may be saturated or unsaturated. Unsaturated hydrocarbons, such as ethene or ethyne, are preferred due to their higher carbon:hydrogen ratio. Following reactive annealing step 702, the pellicle membrane may again undergo vacuum or reductive annealing 701 via route 705. Prior to use in the scanner 704, the pellicle membrane undergoes a vacuum annealing step 703 in order to avoid transient effects during exposures in the scanner environment. Such transient effects include variation in EUV transmissivity of the pellicle membrane following exposure to EUV radiation and hydrogen ions and radicals in the scanner environment within the lithographic apparatus. In another method, as indicated by arrow 706, the pellicle membrane may be used in the scanner without undergoing reactive annealing.

FIG. 12b depicts a schematic flow chart relating to methods of regenerating, conditioning, and/or healing of pellicle membranes which have been exposed to the scanner environment of a lithographic apparatus. Since the pellicle membrane will have been already exposed to the highly reductive atmosphere within the lithographic apparatus, there is no need to further anneal the pellicle in a reductive annealing step. In addition, the pellicle membrane may have become damaged during use and so it will be necessary to repair any damage, which is achieved by reactive annealing in a hydrocarbon atmosphere. After reactive annealing 702, the pellicle membrane may undergo vacuum or reductive annealing 701. This may be repeated. Once the pellicle membrane has been sufficiently repaired, it may again be used 704 in a lithographic apparatus.

Figure 13:
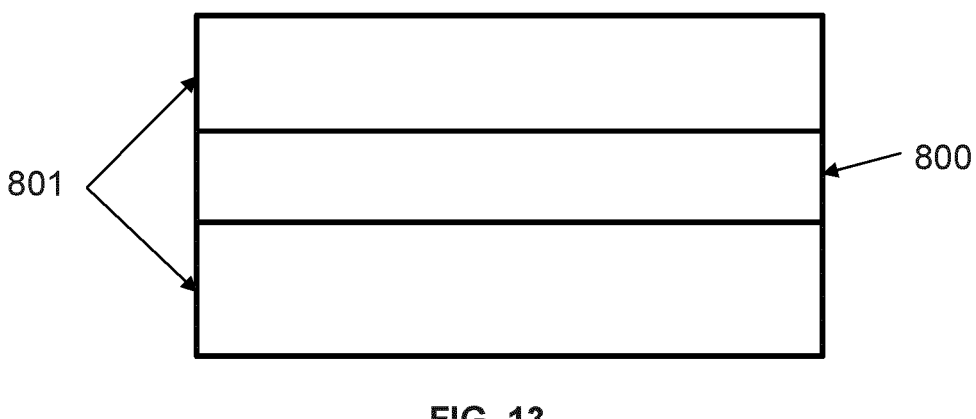
FIG. 13 depicts a schematic cross-section through a pellicle membrane according to the present invention including aerogel layers.

FIG. 13 depicts a cross-section through a pellicle membrane comprising a pellicle membrane layer 800 having an aerogel layer 801 on each face. It will be appreciated that in some embodiments, an aerogel layer 801 is only provided on one face. The aerogel layer 800 is able to protect the underlying pellicle membrane layer 800 from etching by hydrogen plasma. It will be appreciated that other optical elements of a lithographic apparatus may similarly be protected by way of an aerogel.

Figure 14A:
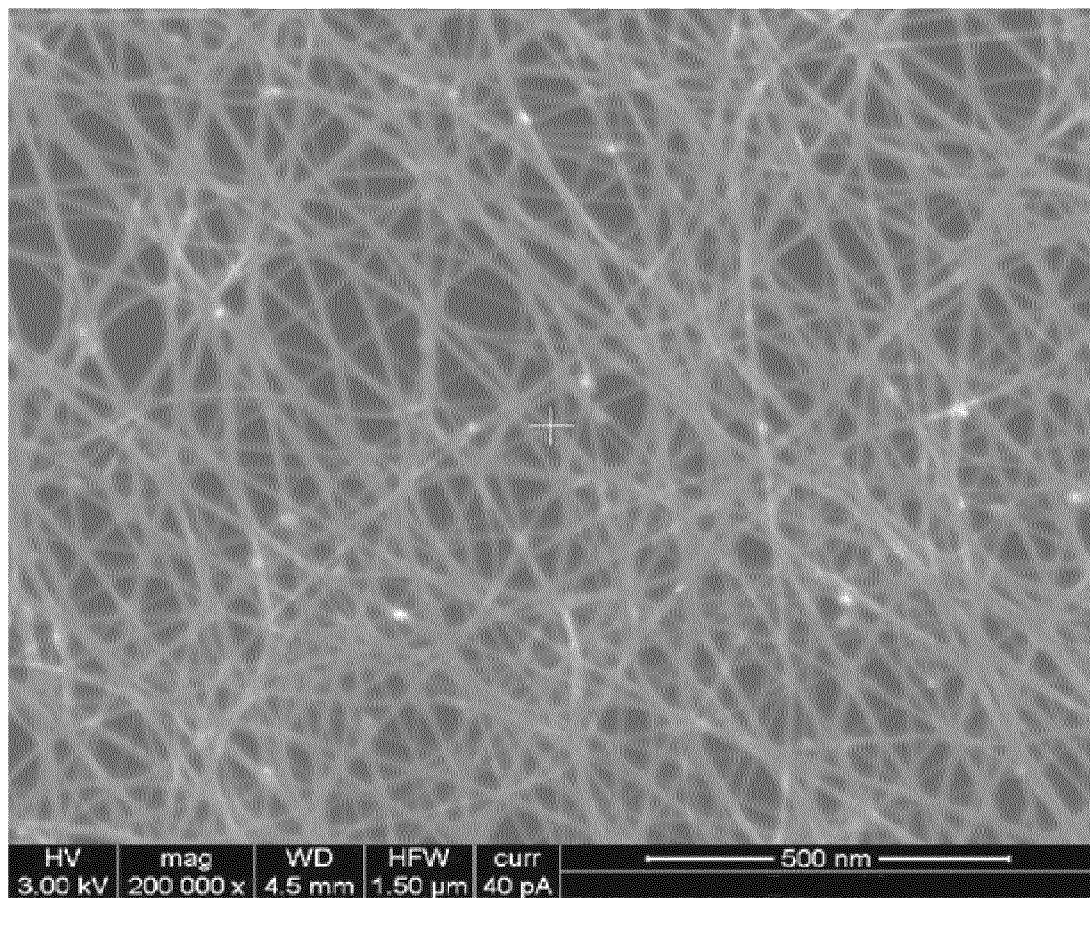
FIGS. 14a and 14b depict scanning electron microscopy images of the same CNT membrane before (FIG. 14a) and after (FIG. 14b) after it has been conditioned according to an embodiment of the present invention.
Figure 14B:
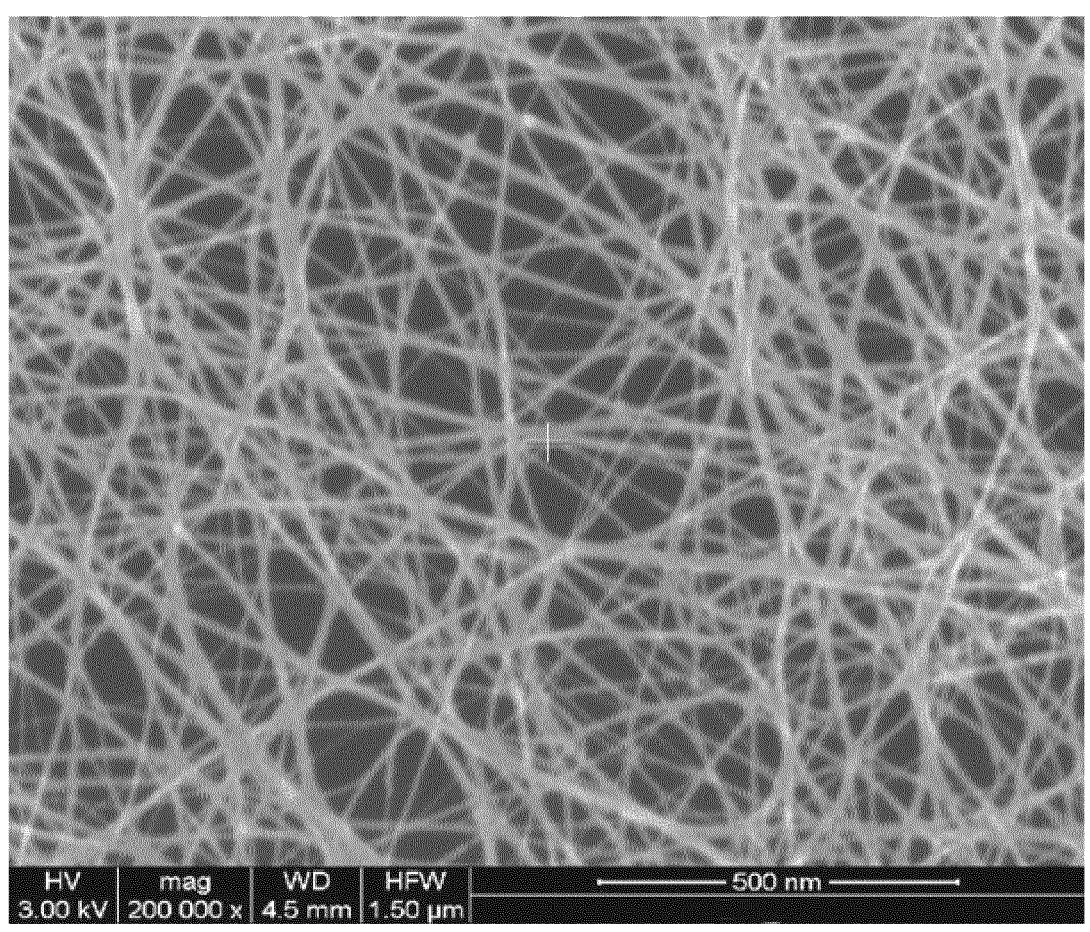

FIGS. 14*a* and 14*b* are scanning electron microscope images of areas of the same CNT membrane. In FIG. 14*a*, the CNT membrane has not yet been conditioned according to the method of the ninth aspect of the present invention. The nanoparticle contaminants can clearly be seen as white dots distributed across the CNT membrane. FIG. 14*b* depicts the same CNT membrane after it has been conditioned. In particular, the CNT membrane was conditioned by exposure to 810 nm radiation. As can be seen, the number of nanoparticle contaminants has been vastly reduced.

Figure 15:
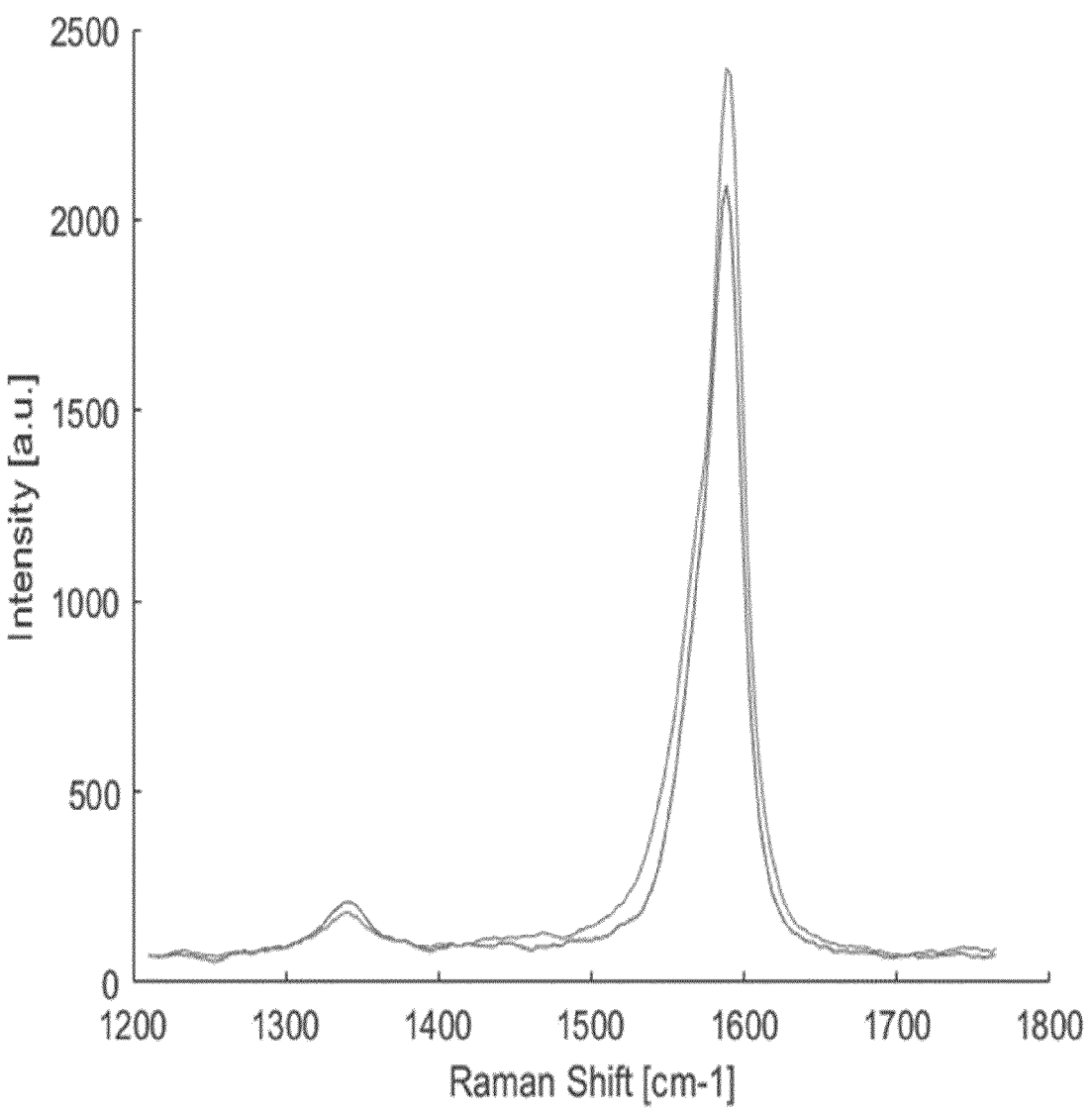
FIG. 15 depicts Raman spectra of a CNT membrane before and after it has been conditioned according to an embodiment of the present invention.

FIG. 15 depicts Raman spectra of an unconditioned CNT membrane and a CNT membrane that has been conditioned according to the ninth aspect of the present invention. Two peaks are observed. The first peak at around 1350 cm$^{-1}$ shows the line relating to the pristine (unconditioned) CNT membrane as being higher than the line relating to the conditioned CNT. At this Raman shift, the higher line indicates a greater degree or amount of defects, which indicates the presence of defective CNTs, amorphous carbon, or both. By conditioning the CNT pellicle membrane, the amount of defects, amorphous carbon, or both is decreased. The peak at around 1580 cm$^{-1}$ shows the line relating to the conditioned CNT pellicle membrane as being higher than the line relating to the unconditioned CNT pellicle membrane. The peak at around 1580 cm$^{-1}$ relates to the amount of crystalline carbon, which demonstrates that the conditioned CNT pellicle membrane has a greater amount of crystalline carbon than the unconditioned CNT pellicle membrane.

Figure 16:
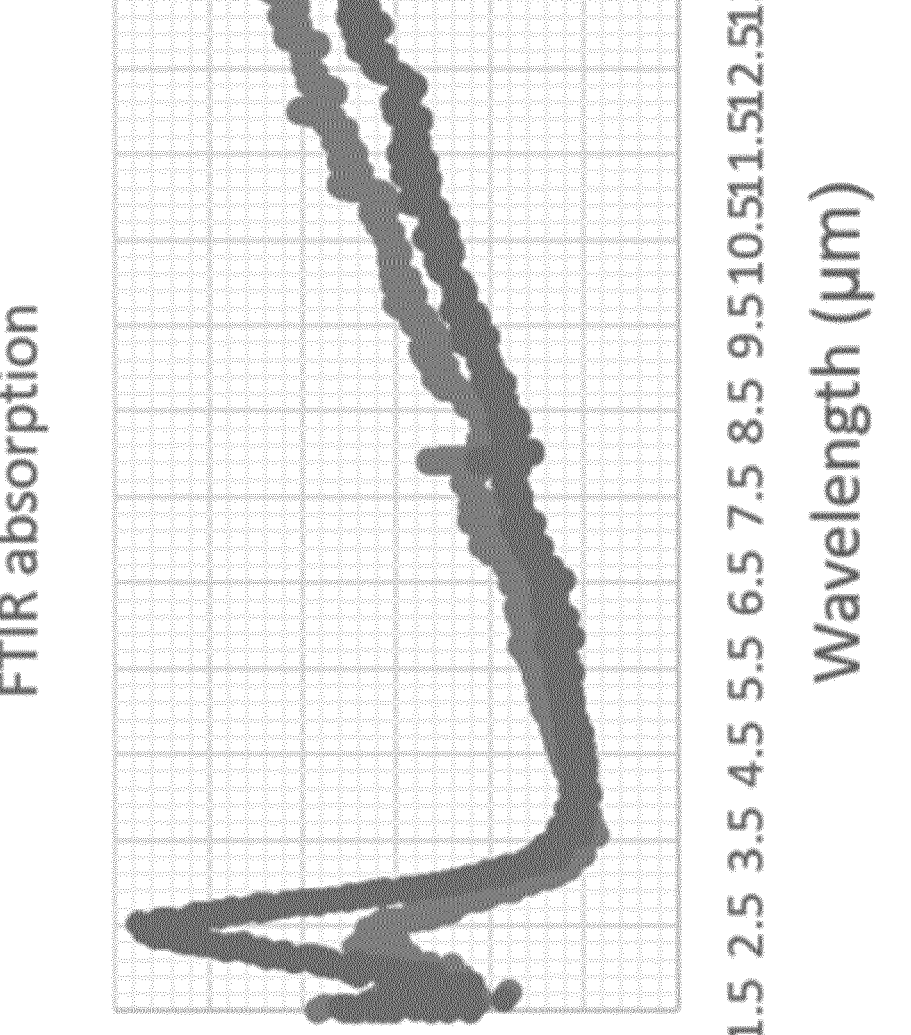
FIG. 16 depicts FTIR spectra of a CNT membrane before and after it has been conditioned according to an embodiment of the present invention.

FIG. 16 depicts FTIR spectra obtained from conditioned and unconditioned areas of a CNT pellicle membrane. The spectrum obtained from the pristine (unconditioned) CNT pellicle membrane shows a lower peak at around 2.5 microns, a similar absorption at around 4 microns, and a generally higher absorption at wavelengths above 4 microns. In contrast, the conditioned (irradiated) CNT pellicle membrane has a much higher absorption peak at 2.5 microns, and then a generally lower absorption at wavelengths above 4 microns. The clear peak at 2.5 microns further indicates the higher crystalline quality of the CNT membrane after conditioning.

It will be appreciated that the various aspects of the invention may be provided or in combination. For example, embodiments including electrical biasing may be used in combination with pellicle membranes described herein or in combination with other types of pellicle membrane. The method of regenerating a pellicle may be used in combination with the method of electrical biasing, and may further include using the pellicle membrane described herein or another type of pellicle membrane.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the various layers may be replaced by other layers that perform the same function.

The descriptions above are intended to be illustrative, not limiting. Thus it will be apparent to one skilled in the art that modifications may be made to the invention as described without departing from the scope of the claims and clauses set out below.

1. A pellicle membrane for a lithographic apparatus, said membrane comprising uncapped carbon nanotubes.

2. A pellicle membrane for a lithography apparatus, said membrane further comprising a plurality of nanoparticles, optionally wherein the nanoparticles are composite nanoparticles.

3. The pellicle membrane according to Clause 2, wherein said nanoparticles are associated with the carbon nanotubes.

4. The pellicle membrane according to Clause 2 or 3, wherein said nanoparticles are disposed on the surface of the carbon nanotubes, or are disposed within the carbon nanotubes, or are disposed on the surface of and within the nanotubes.

5. The pellicle membrane according to any preceding clause, wherein the nanotubes form a gas-permeable mesh.

6. The pellicle membrane according to any preceding clause, wherein the carbon nanotubes are selected from single wall nanotubes, multi wall nanotubes, and combinations thereof.

7. The pellicle membrane according to any preceding clause, wherein the diameter of the nanoparticles is from about 1 nm to about 100 nm, preferably from about 1 nm to about 25 nm.

8. The pellicle membrane according to any preceding clause, wherein the diameter of the nanoparticles is less than half of the critical dimension of a pattern of a corresponding reticle.

9. The pellicle membrane according to any preceding clause, wherein the average distance between adjacent nanoparticles is greater than the diameter of the nanoparticles.

10. The pellicle membrane according to Clause 9, wherein the average distance between adjacent nanoparticles is from around 1 to around 50 times the diameter of the nanoparticles.

11. The pellicle membrane according to Clause 9, wherein the average distance between adjacent nanoparticles is greater or equal to ten times the diameter of the nanoparticles.

12. The pellicle membrane according to any preceding clause, wherein the nanoparticles comprise a material which has a higher recombination coefficient for hydrogen than the nanotubes.

13. The pellicle membrane according to Clause 12, wherein the recombination coefficient of the nanoparticles is from about 0.1 to about 1.

14. The pellicle membrane according to any preceding clause, wherein the material comprising the nanoparticles is selected from the group consisting of: a metal, a metal oxide, a doped metal, an alloy, or combinations thereof.

15. The pellicle membrane according to any preceding clause, wherein the material comprising the nanoparticles is selected from the group consisting of: Nb, Mo, Zr, Y, Ru, Rh, Pt, Pd, W, Cr, Ni, Fe, Co, Ag, Au, and combinations thereof.

16. The pellicle membrane according to Clause 14 or 15, wherein the nanoparticles additionally comprise O, N, B, Si, C, H, S, P, Cl, and combinations thereof.

17. The pellicle membrane according to any preceding clause, wherein a surface density of the nanoparticles is greater than around 500 particles per square micron, preferably greater than around 1000 particles per square micron.

18. The pellicle membrane according to any preceding clause, wherein the uncapped carbon nanotubes have been passivated, preferably chemically passivated.

19. The pellicle membrane according to Clause 18, wherein the uncapped carbon nanotubes have been passivated by chemisorption of chemical species to the surface of the nanotubes.

20. The pellicle membrane according to Clauses 18 or 19, wherein the uncapped carbon nanotubes have been passivated by nitridation, oxidation, or halogenation, or by the addition of strontium, boron, beryllium and/or silicon to the surface of the nanotubes.

21. The pellicle membrane according to any preceding clause, wherein the surface of the uncapped carbon nanotubes has not been intentionally hydrogenated.

22. The pellicle membrane according to any of Clauses 18 to 21, wherein the uncapped carbon nanotubes are passivated by fluorination or chlorination.

23. A pellicle membrane for a lithographic apparatus, said membrane comprising uncapped carbon nanotubes, wherein at least a portion of the surface of the uncapped carbon nanotubes has been chemically passivated, preferably, wherein the chemical passivation includes nitrogenation, oxidation, and/or halogenation.

24. The pellicle membrane according to any preceding clause, wherein the uncapped carbon nanotubes are doped with atoms other than carbon, optionally wherein the atoms other than carbon are nitrogen, boron, and/or silicon.

25. A method of regenerating and/or conditioning a pellicle membrane, said method comprising decomposing a precursor compound and depositing at least some of the products of decomposition onto the pellicle membrane.

26. The method according to Clause 25, wherein the pellicle membrane is the membrane according to any of Clauses 1 to 24.

27. The method of Clause 25 or 26, wherein the precursor is a hydrocarbon, preferably wherein the hydrocarbon is a saturated or unsaturated C1-4 hydrocarbon, or cyclic hydrocarbon (C5 or larger), or aromatic hydrocarbon (C6 or larger), optionally the precursor includes at least one of O, N, B, P, S, Cl.

28. The method of any of Clauses 25 to 27, wherein the precursor compound is provided continuously or intermittently.

29. The method of any of Clauses 25 to 28, wherein an amount of precursor compound is adjusted depending on one or more of: an etch rate of the pellicle membrane, an operating power of a lithographic apparatus in which the pellicle membrane is disposed, and an operational lifetime of the pellicle membrane.

30. The method of any of Clauses 25 to 29, wherein the method comprises directing the precursor compound towards the pellicle membrane.

31. The method of any of Clauses 25 to 29, wherein the method comprises a method of conditioning and/or repairing a carbon nanotube pellicle membrane, said method including the step of annealing the carbon nanotube pellicle membrane in a hydrocarbon-containing atmosphere.

32. The method according to Clause 31, wherein the annealing takes place at a temperature of from around 700 K to around 900 K.

33. The method according to any of Clauses 25 to 32, wherein the method includes a vacuum annealing step, optionally wherein the vacuum annealing step is before and/or after a step of annealing the pellicle membrane in a hydrocarbon-containing atmosphere.

34. The method according to any of Clauses 25 to 33, wherein the method includes a reductive annealing step, optionally wherein the reductive annealing step is before and/or after a reactive annealing step, optionally wherein the reductive annealing step takes place within a reductive gas, such as hydrogen.

35. The method according to any of Clauses 25 to 34, wherein a final annealing step is a vacuum or a reductive annealing step.

36. The method according to any of Clauses 25 to 35, wherein the pellicle membrane is a pellicle membrane according to any of Clauses 1 to 24.

37. A method of regenerating and/or conditioning a pellicle membrane, which is optionally a membrane according to any of Clauses 1 to 24, said method including the steps:
   a) vacuum or reductive annealing;
   b) reactive annealing in a hydrocarbon environment;
   c) optional repetition of steps a) and b); and
   d) a final step of vacuum or reductive annealing.

38. A method of reducing the etch rate of a pellicle membrane, said method comprising providing at least one biased element in the region of the pellicle membrane, preferably wherein the pellicle membrane is a carbon nanotube pellicle membrane.

39. An assembly for a lithographic apparatus, said assembly including a biased pellicle membrane relative to the nearest electrode, that may include a reticle front side and/or a a shutter system and/or an optical filter and/or a purge gas supply, optionally wherein the pellicle membrane and/or reticle front side are floating whilst the shutter system and/or optical filter are biased negatively with respect to a grounded vacuum vessel wall.

40. The assembly according to Clause 39, wherein the absolute bias between any of the electrodes is less than or equal to around −500 V, preferably less than or equal to around −250 V, and more preferably less than or equal to around −50 V, optionally wherein all electrodes are negative relative to a grounded vacuum vessel wall.

41. The assembly according to Clauses 39 or 40, wherein the bias is current limited or pulsed, with pulses optionally synchronized to the EUV pulses.

42. The assembly according to any of Clauses 39 to 41, wherein the pellicle membrane is biased relative to one or more of: a reticle masking unit, a reticle, an optical filter and an auxiliary electrode within a reticle mini-environment.

43. The assembly according to any of Clauses 39 to 42, wherein the assembly includes a reticle masking unit, said reticle masking unit comprising first and second blades, wherein an electrical bias is provided between the blades.

44. The assembly according to any of Clauses 39 to 43, wherein a grounded electrode is provided.

45. A pellicle apparatus for a lithographic apparatus, wherein said pellicle apparatus includes a pellicle membrane and a pellicle heating means.

46. The pellicle apparatus according to Clause 45, wherein the heating means is configured to heat a predetermined portion of the pellicle membrane.

47. The pellicle apparatus according to Clause 45 or Clause 46, wherein the predetermined portion of the pellicle membrane is the portion which is subject to the highest hydrogen ion flux.

48. The pellicle apparatus according to any of Clauses 45 to 47, wherein the heating means comprises i) one or more lasers and/or ii) one or more resistive heating elements.

49. The pellicle apparatus according to Clause 48, wherein the one or more lasers operate in the visible or infrared spectrum.

50. The pellicle apparatus according to Clause 47 or 48i), wherein the apparatus further includes at least one optical element configured to direct laser light onto the pellicle membrane.

51. The pellicle apparatus according to Clause 48ii), wherein the pellicle membrane is connected to a current source such that the material comprising the pellicle membrane acts as a resistive heater.

52. The pellicle apparatus according to Clause 48ii) or Clause 51, wherein conductive strips are provided to distribute the current across at least a portion of the pellicle membrane.

53. The pellicle apparatus according to any of Clauses 45 to 52, wherein the pellicle membrane comprises carbon nanotubes, preferably wherein the pellicle membrane comprises a pellicle membrane according to any of Clauses 1 to 17.

54. A method of extending the operational lifetime of a pellicle membrane, said method including selectively heating an area of the pellicle membrane.

55. The method according to Clause 54, wherein the method includes heating the area of the pellicle which is subject to the highest hydrogen ion flux during operation.

56. The method according to Clause 54 or Clause 55, wherein the heating is effected by directing a laser beam onto the pellicle membrane.

57. The method according to Clause 54, 55, or 56, wherein the laser beam is directed by one or more optical elements.

58. The method according to Clause 54 or Clause 55, wherein the heating is effected by passing a current through the pellicle membrane.

59. The method according to Clause 58, wherein the pellicle membrane is a pellicle membrane according to any of Clauses 1 to 24.

60. A pellicle membrane for a lithographic apparatus, said membrane comprising a network of non-aligned nanotubes.

61. The pellicle membrane according to Clause 50, wherein the network comprises a three-dimensional porous network.

62. The pellicle membrane according to Clause 60 or 61, wherein the nanotubes are singled-walled, double-walled, multi-walled and/or coaxial.

63. The pellicle membrane according to any of Clauses 60 to 62, wherein the membrane comprises a single type of nanotube or two or more types of nanotube.

64. The pellicle membrane according to any of Clauses 60 to 63, wherein the membrane comprises carbon, boron nitride, and/or transition metal chalcogenides.

65. The pellicle membrane according to Clause 64, wherein the transition metal is selected from Mo, W, Sb, or Bi.

66. The pellicle membrane according to Clause 64 or 65, wherein the chalcogenide is selected from S, Se, or Te.

67. The pellicle membrane according to any of Clauses 60 to 66, wherein at least some of the nanotubes include a capping material.

68. The pellicle membrane according to Clause 67, wherein the capping material is selected from a metal oxide, silicon oxide, and hexagonal boron nitride.

69. The pellicle membrane according to Clause 68, wherein the metal of the metal oxide is selected from aluminium, zirconium, yttrium, tungsten, titanium, molybdenum, and hafnium, preferably alpha aluminium oxide.

70. The pellicle membrane according to any of Clauses 60 to 69, wherein the membrane comprises coaxial nanotubes.

71. The pellicle membrane according to Clause 70, wherein the coaxial nanotubes comprise a carbon-nanotube core within a hydrogen-etch resistant nanotube.

72. The pellicle membrane according to Clause 71, wherein the coaxial nanotube comprises a boron nitride nanotube, molybdenum disulphide, or tungsten sulphide shell surrounding the carbon-nanotube core.

73. An optical element for use in a lithographic apparatus, said optical element comprising an aerogel.

74. The optical element according to Clause 73, wherein the optical element is a pellicle membrane, a mirror, a reticle, or a spectral purity filter.

75. The optical element according to Clause 73 or Clause 74, wherein the optical element comprises a pellicle membrane according to any one of Clauses 1 to 24, 45 to 53, or 60 to 72.

76. A lithographic apparatus comprising the pellicle membrane according to any one of Clauses 1 to 24, 45 to 53, or 60 to 72.

77. A method of conditioning a carbon nanotube pellicle membrane, said method including selectively removing metal-containing nanoparticles and/or amorphous carbon from the pellicle membrane by heating the pellicle membrane with electromagnetic radiation, wherein the conditioning takes place outside a lithography apparatus.

78. The method according to Clause 77, wherein the CNT pellicle membrane is heated in a vacuum or in a reducing environment.

79. The method according to Clause 78, wherein the reducing environment comprises one or both of hydrogen and ammonia.

80. The method according to Clause 77, wherein the CNT pellicle membrane is heated in an environment comprising one or more of carbon oxides and oxygen.

81. The method according to any of Clauses 77 to 80, wherein the CNT pellicle membrane is heated for a sufficient time to remove more than 50%, more than 60%, more than 70%, more than 80%, or more than 90% of the metallic nanoparticles.

82. The method according to any of Clauses 77 to 81, wherein the CNT membrane is heated for 15 s, 30 s, 45 s, 60 s, 75 s, 90 s, or for up to 2 minutes, up to 5 minutes, or up to 10 minutes.

83. The method according to any of Clauses 77 to 82, wherein the power of the electromagnetic radiation is around $0.5 \text{ W/cm}^2$, $1 \text{ W/cm}^2$, $2 \text{ W/cm}^2$, $3 \text{ W/cm}^2$, less than $5 \text{ W/cm}^2$, less than $10 \text{ W/cm}^2$, less than $15 \text{ W/cm}^2$, or less than $20 \text{ W/cm}^2$.

84. The method according to any of Clauses 77 to 83, wherein the electromagnetic radiation is infrared or near-infrared radiation, optionally wherein the radiation has a wavelength of from around 700 to around 1000 nm.

The invention claimed is:

1. A membrane for a lithographic apparatus, a metrology tool or an inspection tool, the membrane comprising a network of non-aligned boron nitride nanotubes, transition metal chalcogenide nanotubes, or a combination thereof.

2. The membrane according to claim 1, wherein the nanotubes comprise double-walled or multi-walled nanotubes.

3. The membrane according to claim 1, comprising transition metal chalcogenide nanotubes and wherein the transition metal chalcogenide is tungsten disulphide or antimony telluride.

4. The membrane according to claim 1, comprising two or more types of nanotube.

5. The membrane according to claim 1, comprising carbon.

6. The membrane according to claim 1, comprising transition metal chalcogenide nanotubes and the transition metal is selected from Mo, W, Sb, or Bi.

7. The membrane according to claim 6, wherein the chalcogenide is selected from S, Se, or Te.

8. The membrane according to claim 1, wherein at least some of the nanotubes include a capping material.

9. The membrane according to claim 8, wherein the capping material is selected from: a metal oxide, silicon oxide, or hexagonal boron nitride.

10. The membrane according to claim 9, wherein the capping material comprises metal oxide and the metal of the metal oxide is selected from: aluminum, zirconium, yttrium, tungsten, titanium, molybdenum, or hafnium.

11. The membrane according to claim 8, wherein the coefficient of thermal expansion of the material of the nanotubes and the capping material are similar.

12. The membrane according to claim 1, comprising coaxial nanotubes.

13. The membrane according to claim 12, wherein the coaxial nanotubes comprise a core within a hydrogen-etch resistant nanotube.

14. The membrane according to claim 13, wherein the coaxial nanotubes comprise a boron nitride nanotube, molybdenum disulphide, or tungsten sulphide shell surrounding the core.

15. The membrane according to claim 1, further comprising carbon nanotubes.

16. An optical element for use in a lithographic apparatus, a metrology tool or an inspection tool, the optical element comprising the membrane according to claim 1.

17. The optical element according to claim 16, wherein the optical element is a pellicle membrane, a mirror, a reticle, or a spectral purity filter.

18. A membrane for a lithographic apparatus, a metrology tool or an inspection tool, the membrane comprising transition metal chalcogenide nanotubes.

19. The membrane according to claim 18, wherein the transition metal is selected from Mo, W, Sb, or Bi.

20. A membrane for a lithographic apparatus, a metrology tool or an inspection tool, the membrane comprising a network of non-aligned boron nitride nanotubes.

* * * * *